(12) United States Patent
Juengling

(10) Patent No.: US 10,366,994 B2
(45) Date of Patent: Jul. 30, 2019

(54) MEMORY DEVICES WHICH INCLUDE MEMORY ARRAYS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/975,598

(22) Filed: May 9, 2018

(65) Prior Publication Data

US 2018/0261602 A1     Sep. 13, 2018

Related U.S. Application Data

(62) Division of application No. 15/390,959, filed on Dec. 27, 2016, now Pat. No. 10,008,503.

(51) Int. Cl.
| | |
|---|---|
| *H01L 29/66* | (2006.01) |
| *H01L 21/00* | (2006.01) |
| *H01L 27/108* | (2006.01) |
| *H01L 29/78* | (2006.01) |
| *G11C 11/409* | (2006.01) |

(52) U.S. Cl.
CPC ...... *H01L 27/10826* (2013.01); *G11C 11/409* (2013.01); *H01L 27/10805* (2013.01); *H01L 27/10847* (2013.01); *H01L 27/10879* (2013.01); *H01L 29/66795* (2013.01); *H01L 29/785* (2013.01)

(58) Field of Classification Search
CPC .............. H01L 27/10826; H01L 27/1085

USPC .......... 438/156, 173, 192; 257/328
See application file for complete search history.

(56) References Cited

U.S. PATENT DOCUMENTS

| | | | |
|---|---|---|---|
| 8,741,758 B2 | 6/2014 | Juengling | |
| 10,008,503 B1* | 6/2018 | Juengling | ......... H01L 27/10826 257/328 |
| 2009/0237996 A1 | 9/2009 | Kirsch et al. | |
| 2011/0193157 A1 | 8/2011 | Juengling | |
| 2014/0185355 A1 | 7/2014 | Juengling | |
| 2014/0374809 A1* | 12/2014 | Park | .................... H01L 27/1085 257/296 |

FOREIGN PATENT DOCUMENTS

| | | |
|---|---|---|
| CN | 101964382 A | 2/2011 |
| CN | 102194930 A | 9/2011 |

\* cited by examiner

*Primary Examiner* — Calvin Lee
(74) *Attorney, Agent, or Firm* — Wells St. John P.S.

(57) ABSTRACT

Some embodiments include a memory device. The device has a fin with a first source/drain region, a second source/drain region and a channel region. The first source/drain region extends to a first height. The second source/drain region extends to a second height less than the first height. The channel region extends along a trough between the first and second source/drain regions. A charge-storage device is over the first source/drain region. A first sense/access line is along a sidewall of the fin and is spaced from the channel region by dielectric material. A second sense/access line is over the second source/drain region. An uppermost surface of the second sense/access line is beneath an uppermost surface of the first source/drain region. Some embodiments include memory arrays, and some embodiments include methods of forming memory arrays.

9 Claims, 34 Drawing Sheets

US 10,366,994 B2

1

MEMORY DEVICES WHICH INCLUDE MEMORY ARRAYS

RELATED PATENT DATA

This patent resulted from a divisional of U.S. patent application Ser. No. 15/390,959, which was filed Dec. 27, 2016, and which is hereby incorporated herein by reference.

TECHNICAL FIELD

Memory devices, memory arrays, and methods of forming memory arrays.

BACKGROUND

Fin field effect transistors (finFETs) may be incorporated into integrated circuitry. Each finFET includes a fin (a tall thin semiconductor member) extending generally perpendicularly from a substrate. The fin comprises a pair of opposing sidewalls, and gate material is provided along at least one of the sidewalls. The gate material is spaced from the sidewall by gate dielectric material. A pair of source/drain regions is provided within the fin, and a channel region extends between the source/drain regions. In operation, the gate is utilized to selectively control current flow within the channel region.

The finFETs may be utilized as access transistors in integrated memory arrays; such as, for example, dynamic random access memory (DRAM) arrays. In some applications the finFETs may be incorporated into crosshair memory cells. In such applications the source/drain regions are on a pair of upwardly-projecting pedestals, and the channel region is along a trough extending between the pedestals. A charge-storage device (for instance, a capacitor) is electrically coupled with one of the source/drain regions, and a digit line is electrically coupled with the other of the source/drain regions. The gate is beneath the source/drain regions, and extends along the trough comprising the channel region. Example finFET structures, and example crosshair memory cells, are described in U.S. Pat. No. 8,741,758, and U.S. patent publication numbers 2009/0237996 and 2011/0193157.

It is desired to develop improved finFET devices which are suitable for utilization in highly integrated applications, to develop improved architectures for incorporating finFET devices into highly integrated memory and/or other circuitries, and to develop improved methods for fabricating architectures comprising finFET devices.

BRIEF DESCRIPTION OF THE DRAWINGS

FIGS. 5, 7, 9, 11, 13, 15, 17, 19, 21, 23, 25, 27, 29, 31 and 33 are top views at sequential process stages. FIGS. 6, 8, 10, 12, 14, 16, 18, 20 and 22 are views along the lines B-B of the top views at sequential process stages. FIGS. 24, 26, 28, 30, 32 and 34 are views along the lines A-A of the top views at sequential process stages.

DETAILED DESCRIPTION OF THE ILLUSTRATED EMBODIMENTS

Some embodiments include memory device architectures having crosshair memory cells with one of the source/drain region pedestals being recessed relative to the other of the source/drain region pedestals. A digit line may be electrically coupled with the recessed pedestal, and a charge-storage device (for instance a capacitor) may be electrically coupled with the non-recessed pedestal. The architectures may enable the digit line to be recessed entirely below the charge-storage device, which can enable portions of the charge-storage device to extend over regions of the digit line; and thereby enable higher integration relative to conventional architectures. Some embodiments include memory arrays comprising recessed digit lines, and some embodiments include methods of forming memory arrays. These and other aspects are described with reference to FIGS. 1-34.

Figure 1:
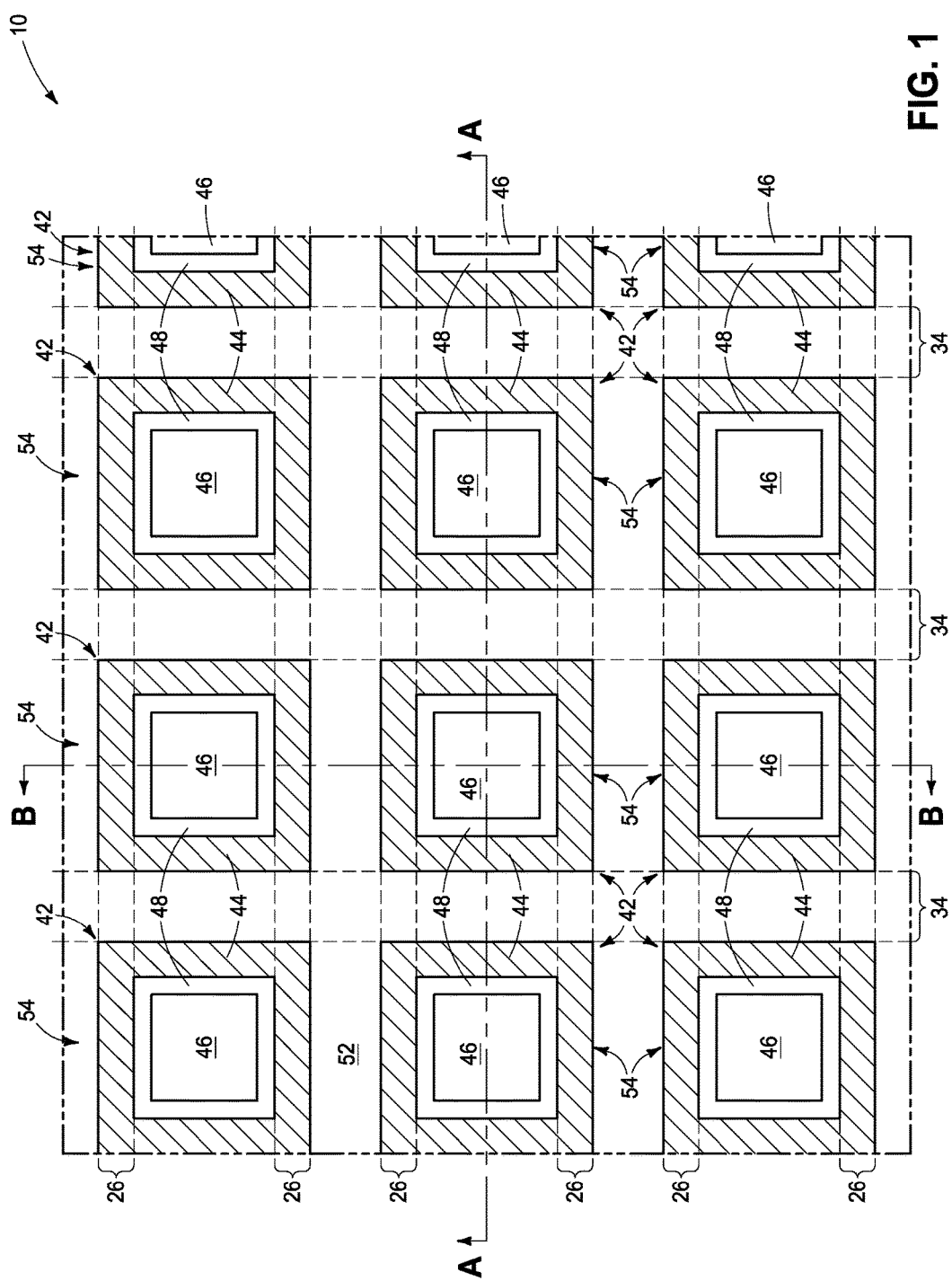
FIGS. 1-3 are a diagrammatic cross-sectional top view and diagrammatic cross-sectional side views of a region of an example memory array. The view of FIG. 2 is along the lines A-A of FIGS. 1 and 3; the view of FIG. 3 is along the lines B-B of FIGS. 1 and 2; and the view of FIG. 1 is along the lines C-C of FIGS. 2 and 3.
Figure 2:
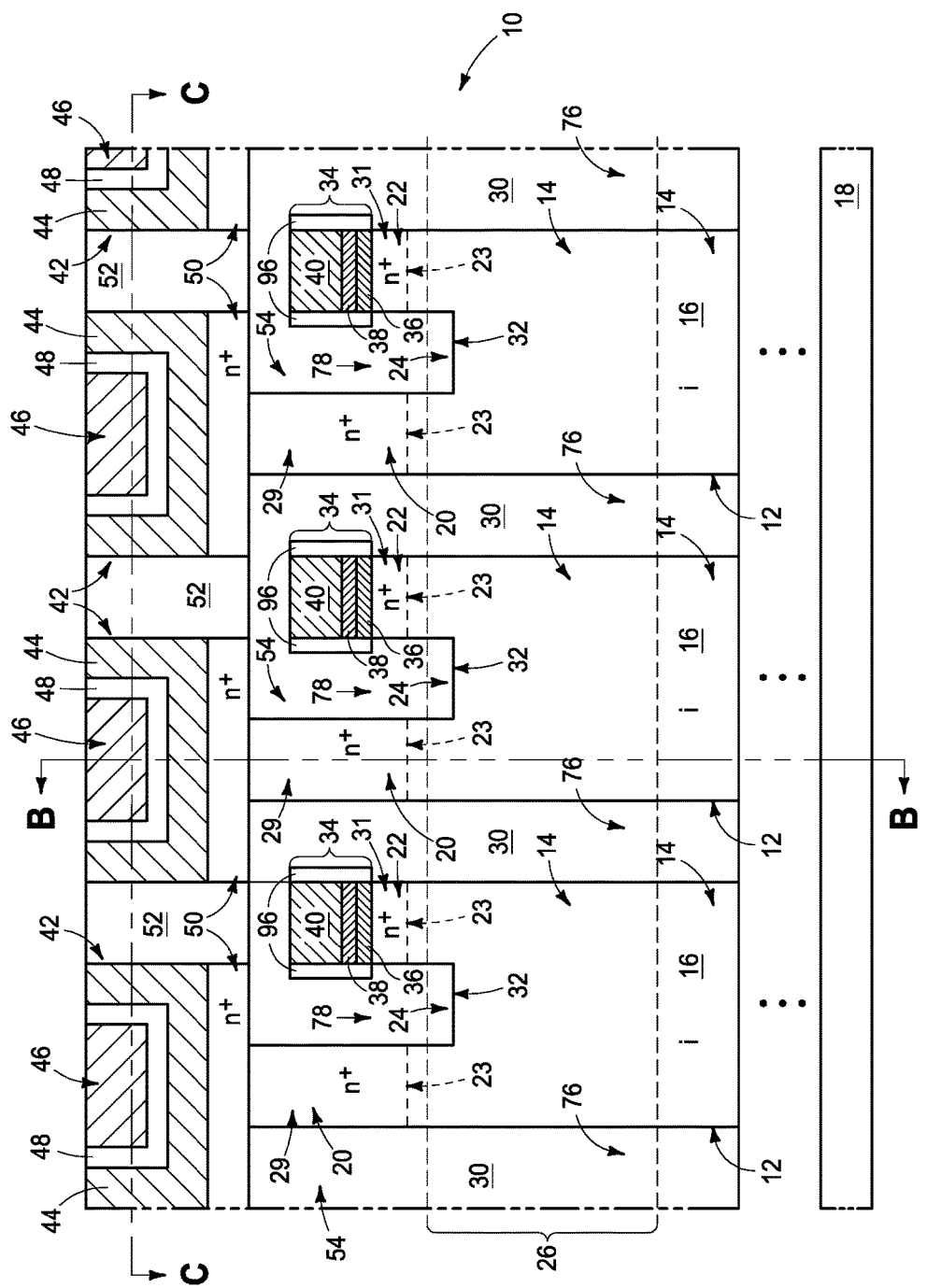
Figure 3:
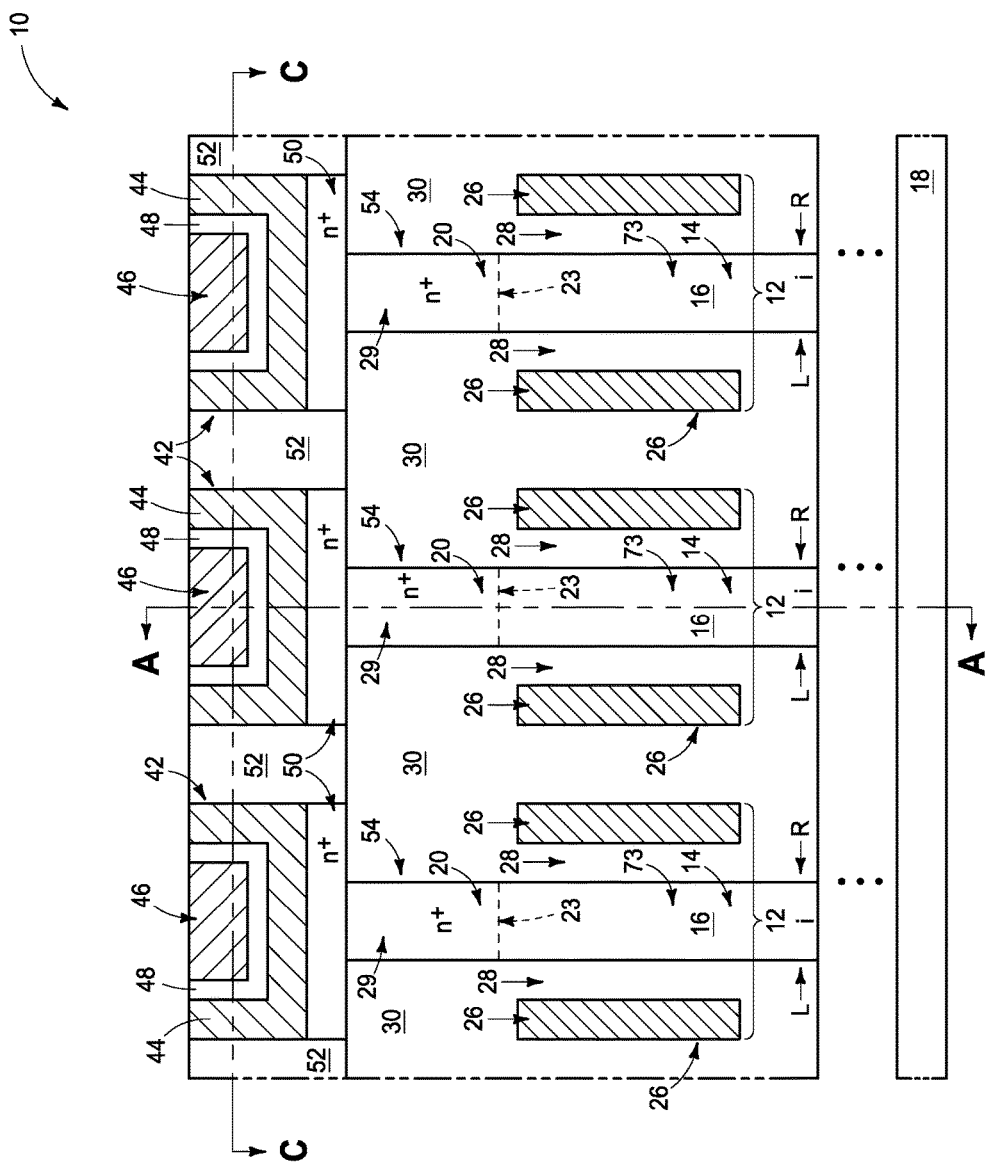

A portion of an example memory array 10 is diagrammatically illustrated in FIGS. 1-3. The memory array includes a plurality of finFET transistors 12 (shown in FIGS. 2 and 3) arranged in rows and columns. Each finFET transistor includes a fin 14 of semiconductor material 16. The fins extend upwardly from a substrate 18.

The substrate 18 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the substrate 18 may correspond to a semiconductor substrate containing one or more materials associated with integrated circuit fabrication. Such materials may include, for example, one or more of refractory metal materials, barrier materials, diffusion materials, insulator materials, etc. The substrate 18 is illustrated to be spaced from fins 14 to indicate that there may be circuitry, materials, levels, etc. (not shown) between the substrate and the fins in some embodiments. In some embodiments, the substrate 18 may be in direct contact with the fins 14.

The semiconductor material 16 of fins 14 may comprise any suitable semiconductor material, and in some embodiments may comprise, consist essentially of, or consist of silicon.

The fins 14 are shown to comprise a pair of upwardly-extending pedestals 20 and 22, and to have a trough (i.e., valley) 24 between the pedestals 20/22. In the illustrated embodiment, the pedestal 22 is shorter than the pedestal 20 (or in other words, is recessed relative to the pedestal 20). In some embodiments the pedestal 20 may be considered to extend to a first height over substrate 18, and the pedestal 22 may be considered to extend to a second height over substrate 18 which is less than the first height. The pedestals 20 may be referred to as first pedestals, and the pedestals 22 may be referred to as second pedestals.

Upper regions of the pedestals 20/22 are illustrated to be heavily doped with n-type dopant (i.e., are shown to be at an n+ dopant level). The heavy doping may correspond to, for example, a dopant concentration in excess of $10^{20}$ atoms/$cm^3$. Dashed lines 23 are provided to diagrammatically illustrate approximate boundaries of the heavily-doped regions.

The heavily-doped regions correspond to source/drain regions 29 and 31; and the pedestals 20/22 may be referred to as source/drain region pedestals. In some embodiments the source/drain regions 29 may be referred to as first source/drain regions, and the source/drain regions 31 may be referred to as second source/drain regions.

Lower regions of fins 14 are indicated to be intrinsically doped (specifically, are indicated to be at a dopant level "i"). The intrinsic dopant level may correspond to a dopant level of less than or equal to about $10^{15}$ atoms/$cm^3$. In some embodiments the lower regions of the fins may have p− dopant levels, with such dopant levels corresponding to less than or equal to about $10^{16}$ atoms/$cm^3$.

Wordlines 26 extend along sidewalls of the fins 14, and are spaced from such sidewalls by gate dielectric material 28. The wordlines 26 and gate dielectric material 28 are shown in FIG. 3. A wordline 26 is also diagrammatically illustrated in FIG. 2 in dashed-line (i.e., phantom) view since the wordline is out of the plane relative to the view of FIG. 2 (i.e., is in front of the plane). Wordlines 26 are also diagrammatically illustrated in FIG. 1 in dashed-line (i.e., phantom) view since the wordlines are below the plane of the FIG. 1 view.

The wordlines may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The gate dielectric material 28 may comprise any suitable electrically insulative material, such as, for example, silicon dioxide. In the shown embodiment the gate dielectric material 28 merges with other dielectric material 30 that surrounds the fins 14 and other structures (for instance, wordlines 26). Such implies that the gate dielectric material 28 comprises a common composition as the other dielectric material 30. In other embodiments the gate dielectric material 28 may comprise a different composition than at least some of the remaining dielectric material 30. Further, although the dielectric material 30 is illustrated to be a single homogeneous composition, in other embodiments the dielectric material 30 may comprise two or more different compositions.

The wordlines 26 comprise gates of the finFET transistors 12. In the illustrated embodiment each transistor 12 has a pair of gates which are along opposing sidewalls of the fin 14 (as shown in FIG. 3). In other embodiments the paired gates may be replaced by a single gate which extends along only one of the sidewalls of the fin 14. The wordlines 26 may have any suitable width dimension along the cross-section of FIG. 3; including, for example, F/2, F/4, F/6, etc., where F is a minimum feature size of a photolithographic process utilized during fabrication of the wordlines 26.

The transistors 12 may be each considered to comprise the pair of source/drain regions 29 and 31, and to comprise a channel region 32 (shown in FIG. 2) extending between the source/drain regions. Current flow along the channel regions is selectively activated by selectively energizing wordlines. The wordlines 26 do not overlap the heavily-doped source/drain regions 29/31 in the illustrated embodiment. In practice, there may be lightly-doped extension regions provided between the heavily-doped source/drain regions and the gates in this and other embodiments described herein. The lightly-doped extension regions may be implanted regions and/or may form operationally during operation of gated devices.

The illustrated finFET transistors 12 are n-type devices in that they comprise n-type doped source/drain regions 29/31. In other embodiments doping may be reversed relative to the illustrated doping so that the transistors are p-type devices comprising p-type doped source/drain regions instead of n-type doped source/drain regions.

Digit lines 34 are electrically coupled with the second source/drain regions 31 of the transistors 12. The digit lines comprise electrically conductive materials 36, 38 and 40. In some embodiments the electrically conductive material 36 corresponds to conductively-doped semiconductor material (for instance, n-type doped mono-silicon or polysilicon), the conductive material 38 corresponds to metal silicide (for instance, titanium silicide), and the conductive material 40 corresponds to metal and/or a metal-containing composition (for instance, titanium, titanium nitride, tungsten, etc.). Although the digit lines are shown comprising the three materials 36, 38 and 40, in other embodiments the digit lines may comprise more than three materials or fewer than three materials. For instance, in some embodiments the digit lines may comprise, in ascending order from upper surfaces of source/drain regions 31, conductively-doped mon-silicon or polysilicon, titanium silicide, titanium and titanium nitride.

It may be advantageous for the digit lines to comprise metal-containing material (i.e., pure metal and/or metal-containing compositions) in that such may enable the digit lines to have low resistance. Any suitable metal-containing materials may be utilized, including, for example, materials comprising one or more of titanium, cobalt, nickel and platinum. The metal-containing materials may be provided over conductively-doped silicon (e.g., material 36 of the illustrated embodiment), with the conductively-doped silicon being utilized to achieve desired electrical contact and adhesion with the source/drain regions 31.

Charge-storage devices 42 are electrically coupled with the first source/drain regions 29. The charge-storage devices 42 may be capacitors or any other structures suitable for reversibly storing charge. In the illustrated embodiment, the charge-storage devices 42 correspond to capacitors. The capacitors have first and second nodes (i.e., electrodes) 44 and 46, and capacitor dielectric material 48 between the first and second nodes. In the illustrated embodiment, the first nodes 44 are shaped as upwardly-opening containers, and the capacitor dielectric material 48 and second nodes 46 extend into such containers. The capacitors may have other configurations in other embodiments.

The nodes 44 and 46 may comprise any suitable electrically conductive materials or combinations of materials; and in some embodiments may comprise, consist essentially of, or consist of one or more metals (for instance, titanium, platinum, etc.), metal-containing compositions (for instance, metal nitrides, metal silicides, alloys of two or more metals, etc.) and/or conductively-doped semiconductor materials (for instance, conductively-doped silicon, conductively-doped germanium, etc.). The capacitor dielectric material 48 may comprise any suitable composition or combination of compositions; including, for example, ferroelectric material and/or non-ferroelectric material. In some example embodiments, the capacitor dielectric material 48 may comprise, for example, one or more of silicon dioxide, silicon nitride, aluminum oxide, etc.

In the shown embodiment, the capacitors 42 are provided over conductive pads 50, which in turn directly contact upper surfaces of the first source/drain regions 29. The conductive pads comprise n-type doped semiconductor material (e.g., silicon), and may be epitaxially grown over semiconductor material of the source/drain regions 29 in some embodiments. Alternatively, or additionally, at least some of the semiconductor material of pads 50 may be deposited and subsequently patterned with appropriate masking technology. In the illustrated embodiment the outer lateral boundaries of pads 50 and capacitors 42 are square-shaped. Such outer lateral boundaries may have other configurations in other embodiments, and may, for example, have circular configurations, elliptical configurations, rectangular configurations, etc.

The capacitors 42 are shown to be electrically isolated from one another by insulative material 52. Such insulative material may comprise any suitable composition or combination of compositions; and may, for example, include one or both of silicon dioxide and silicon nitride. The material 52 may comprise a same composition as the insulative material 30, or may comprise a different composition than the insulative material 30.

An advantage of having the digit lines 34 recessed is that such can enable additional room for the capacitors 42. In the illustrated embodiment, the capacitors 42 extend to over the digit lines 34. In some embodiments, the first source/drain regions 29 may have upper surfaces with an area of approximately x by x (where x is a dimension), and each of the capacitors 42 may extend across an area of approximately 2x by 2x. For instance, the upper surfaces of the first source/drain regions 29 may be formed to a size of about F/2 by F/2 (where "F" is a minimum feature size of a lithographic method utilized during patterning of the source/drain regions), and each of the capacitors 42 may extend across an area of approximately F by F. The source/drain regions may be formed to the dimension of F/2 by F/2 utilizing any suitable methodologies, including, for example, photolithography in combination with so-called pitch-doubling technologies (where, in accordance with conventional parlance, pitch-doubling actually means that a pitch is reduced by one-half).

The combination of an access transistor 12 with a capacitor 42 forms a memory cell 54, with a charge state of the capacitor 42 corresponding to a memory state of the memory cell 54. The memory cells are arranged in rows and columns across the memory array 10. The wordlines 26 and digit lines 34 are diagrammatically illustrated in FIG. 1 in phantom view to indicate that the wordlines 26 and digit lines 34 are beneath the plane of the view of FIG. 1. The wordlines 26 extend along rows of the memory cells 54 within the memory array 10, and the digit lines 34 extend along columns of the memory cells 54 within the memory array 10.

The embodiment of FIGS. 1-3 is described in a context in which the lines 26 comprising gates of access transistors 12 are referred to as wordlines (i.e., access lines), and the lines 34 along the second source/drain regions 31 are referred to as digit lines (i.e., sense lines). Such would be a typical context for operation of the memory array 10 during reading/writing operations relative to the memory cells 54. However, such is not the only context for operation of the memory array 10. An alternative operational context may utilize lines 26 is the sense lines and lines 34 is the access lines. Accordingly, in some embodiments the lines 26 and 34 may be generically referred to as first and second sense/access lines, respectively.

Figure 4:
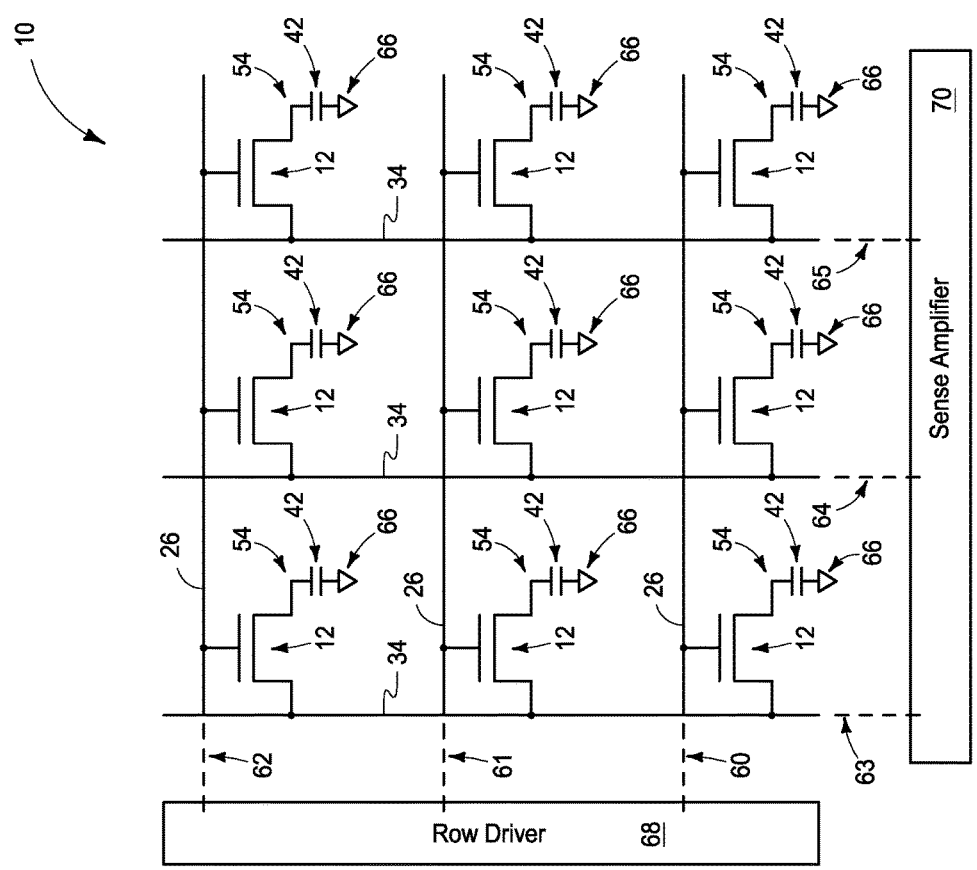
FIG. 4 is a schematic diagram of a portion of an example memory array.

An advantage of including metal within the recessed lines 34 is that such may reduce resistance within the recessed lines to the extent such that the recessed lines may extend outwardly beyond the memory array 10 and into a region peripheral to the memory array. FIG. 4 diagrammatically illustrates the memory array 10 comprising the first sense/access lines 26 arranged in rows 60-62, and comprising the second access/sense lines 34 arranged in columns 63-65. The memory cells 54 are shown to comprise the access transistors 12 in combination with the capacitors 42. Each capacitor has one node electrically coupled with a source/drain region of the access transistor 12, and has one node electrically coupled with cell plate 66. The "cell plate" 66 may be at any suitable reference voltage, including, but not limited to 0 V, a power supply voltage VCC, a half of the VCC voltage (½ VCC), or the like, depending on applications.

The rows 60-62 extend to Row Driver circuitry 68 which is provided peripherally to the memory array 10, and the columns 63-65 extend to Sense Amplifier circuitry 70 which is also provided peripherally to the memory array 10. The Row Driver circuitry 68 and Sense Amplifier circuitry 70 are examples of circuitry which may be provided peripherally to the memory array 10, and in other embodiments other circuitry may be provided peripherally adjacent the memory array in addition to, or alternatively to, the Row Driver circuitry 68 and the Sense Amplifier circuitry 70. The Row Driver circuitry 68 is typically electrically coupled with access lines, and the Sense Amplifier circuitry 70 is typically electrically coupled with sense lines.

The embodiment of FIG. 4 illustrates that recessed lines 34 within columns 63-65 may extend outwardly of memory array 10 to circuitry peripheral to the memory array, such as, for example, the illustrated Sense Amplifier circuitry 70. The embodiment of FIG. 4 illustrates an application in which the recessed lines 34 correspond to sense lines (e.g., digit lines). As discussed above, in some embodiments, the recessed lines 34 may correspond to access lines. In such embodiments, the recessed lines 34 may extend peripherally to the Row Driver circuitry 68, rather than to the Sense Amplifier circuitry 70.

The memory array of FIGS. 1-3 may be formed with any suitable processing. An example method of forming such memory array is described with reference to FIGS. 5-34.

Figure 5:
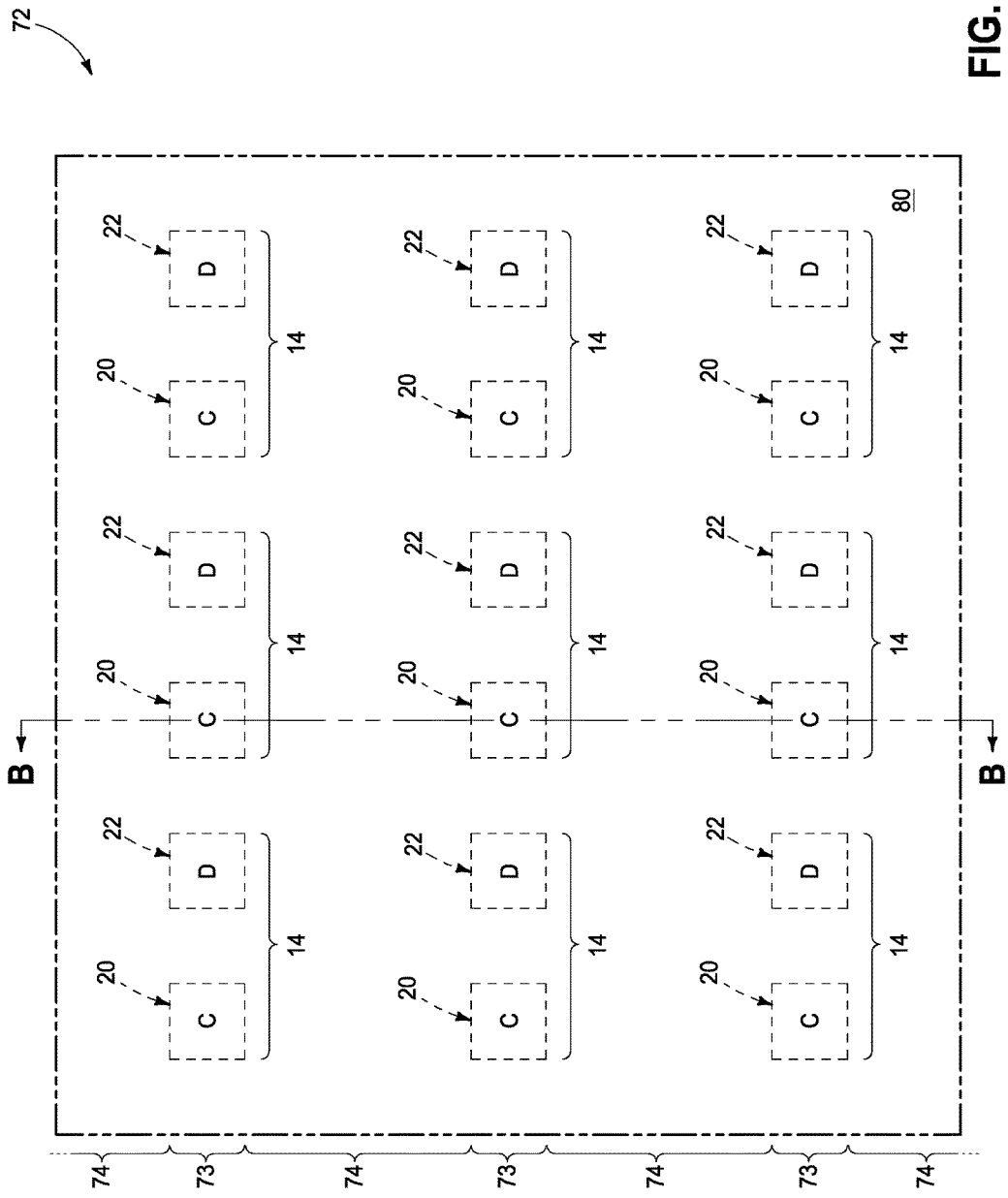
FIGS. 5-34 are diagrammatic top views and diagrammatic cross-sectional side views of a region of a construction at various process stages of an example method of forming an example memory array.
Figure 6:
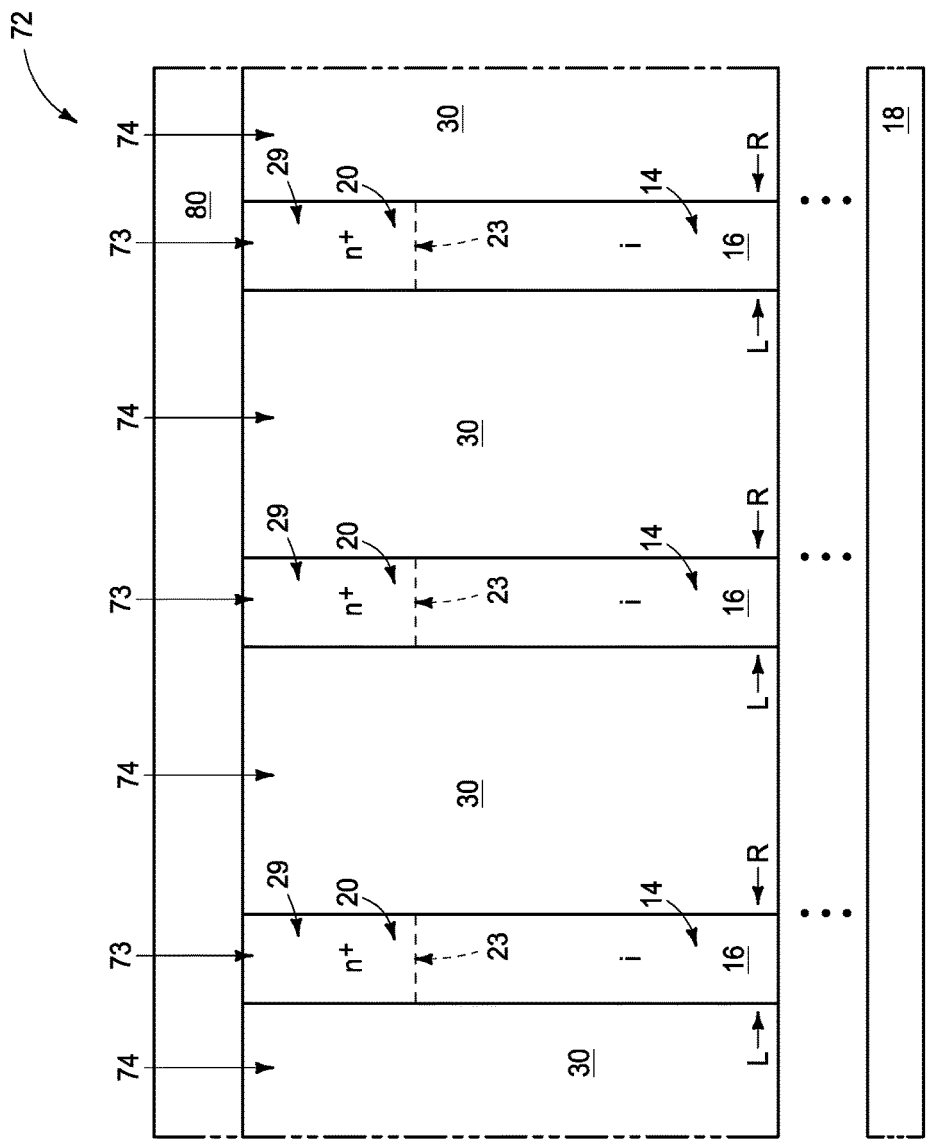

Referring to FIGS. 5 and 6, a construction 72 comprises rows 73 of the fins 14. The rows 73 are spaced from one another by gaps 74 comprising the dielectric material 30.

Figure 24:
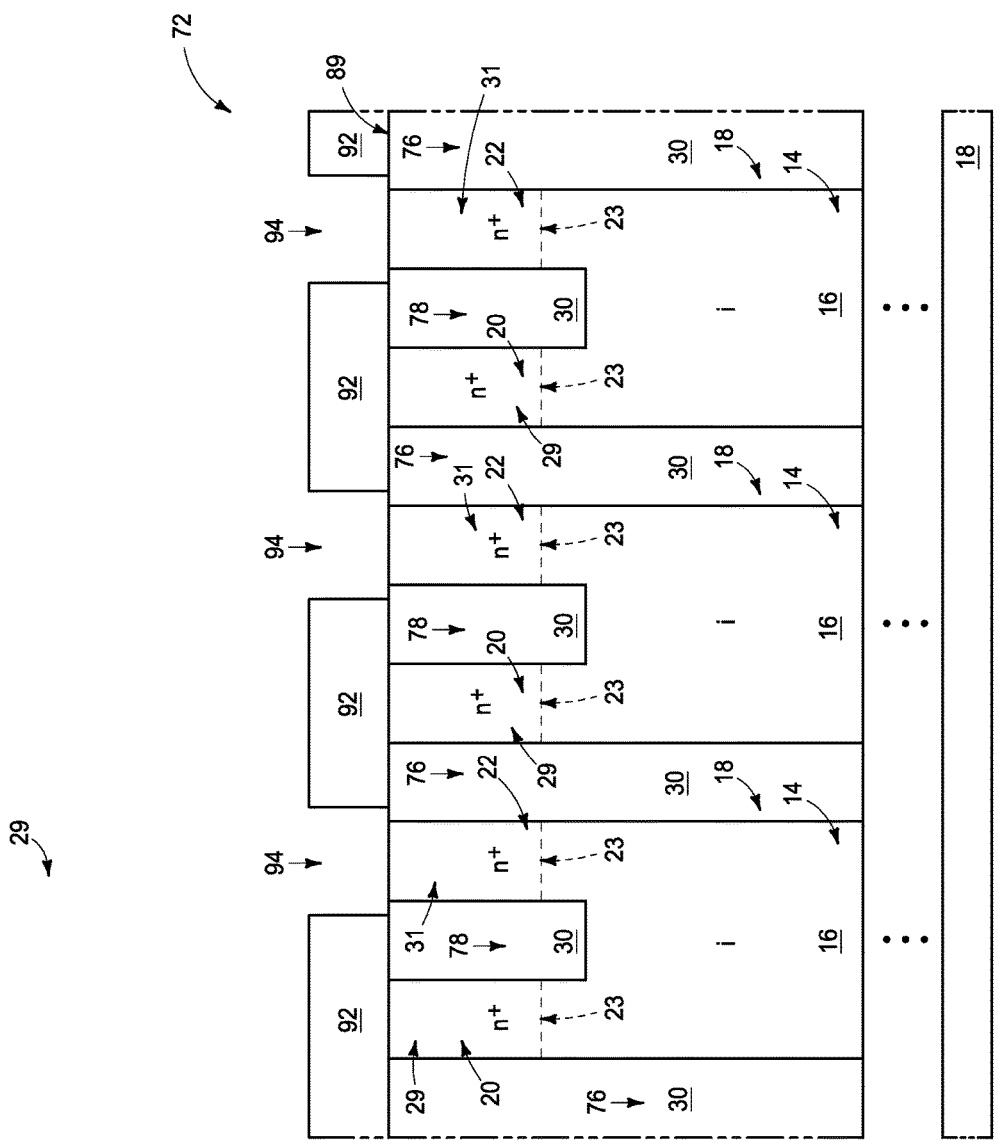

FIG. 2 shows that the dielectric material 30 is formed in deep trenches 76 between adjacent fins 14, and is formed in shallow trenches 78 that extend into the fins. The shallow trenches 78 separate the upwardly-projecting pedestals 20 and 22 from one another, and form the troughs 24 between the pedestals 20/22. The individual fins 14 of FIG. 2 are electrically isolated from one another by the dielectric material 30 within the deep trenches 76, and also by insulative regions along bottoms of the fins (such insulative regions may correspond to undoped silicon that the fins are etched into, and that extends between bases of the fins, with the silicon between the bases of the fins not being visible in FIG. 2). The dielectric material 30 at the processing stage of FIGS. 5 and 6 may be configured in deep and shallow trenches 76 and 78 of the type described above with reference to FIG. 2 (with the deep and shallow trenches 76 and 78 of construction 72 being shown in FIG. 24, which is a processing stage following that of FIGS. 5 and 6 with the same fins 14 as are present at the processing stage of FIGS. 5 and 6). Accordingly, the fins 14 of FIGS. 5 and 6 may have a configuration similar to that described above with reference to FIGS. 2 and 3. Specifically, each fin may have a pair of upwardly-projecting pedestals 20/22 (FIG. 2), but at the processing stage of FIGS. 5 and 6 both pedestals may have a same height as one another (as shown in FIG. 24). The pedestals 20 are shown in FIG. 6 as being n-type doped, and as being over intrinsically doped lower regions of the fins 14 (analogous to the configuration of FIG. 3). Similarly, the pedestals 22 (not visible in FIGS. 5 and 6) may be n-type doped at the processing stage of FIGS. 5 and 6. The dielectric material 30 within the gaps 74 between rows 73 may be referred to as insulative material fill.

Dopant may be provided in pedestals 20/22 (FIGS. 1-3) to form source/drain regions 29/31 (FIGS. 1-3) prior to the processing stage of FIGS. 5 and 6 (as shown), or may be provided at a subsequent process stage.

A masking material 80 extends across upper surfaces of the dielectric material 30 and fins 14. The masking material 80 may comprise any suitable composition or combination of compositions. In some embodiments, the masking material 80 may comprise one or more of silicon dioxide, carbon, photoresist, antireflective coatings, etc.

Regions of the fins 14 are diagrammatically illustrated in FIG. 5. Specifically, pedestals 20 and 22 are diagrammatically illustrated in phantom view. Ultimately, the pedestals 20 are connected to capacitors (or other suitable charge-storage devices) and the pedestals 22 are connected to digit lines; and accordingly the pedestals 20 are labeled with a "C" and the pedestals 22 are labeled with a "D".

Each of the rows 73 of fins 14 has a pair of opposing sides. The view of FIG. 6 shows that the opposing sides may be considered to be a left side (L) and a right side (R). In processing the follows, a wordline is first formed along the left side of a row of fins 14, and subsequently another wordline is formed along the right side of the row of fins 14. In other embodiments a first wordline may be formed along the right side of the illustrated row of fins 14 and subsequently a second wordline may be formed along the left side of the illustrated row of fins 14 with analogous processing to that described herein.

Figure 7:
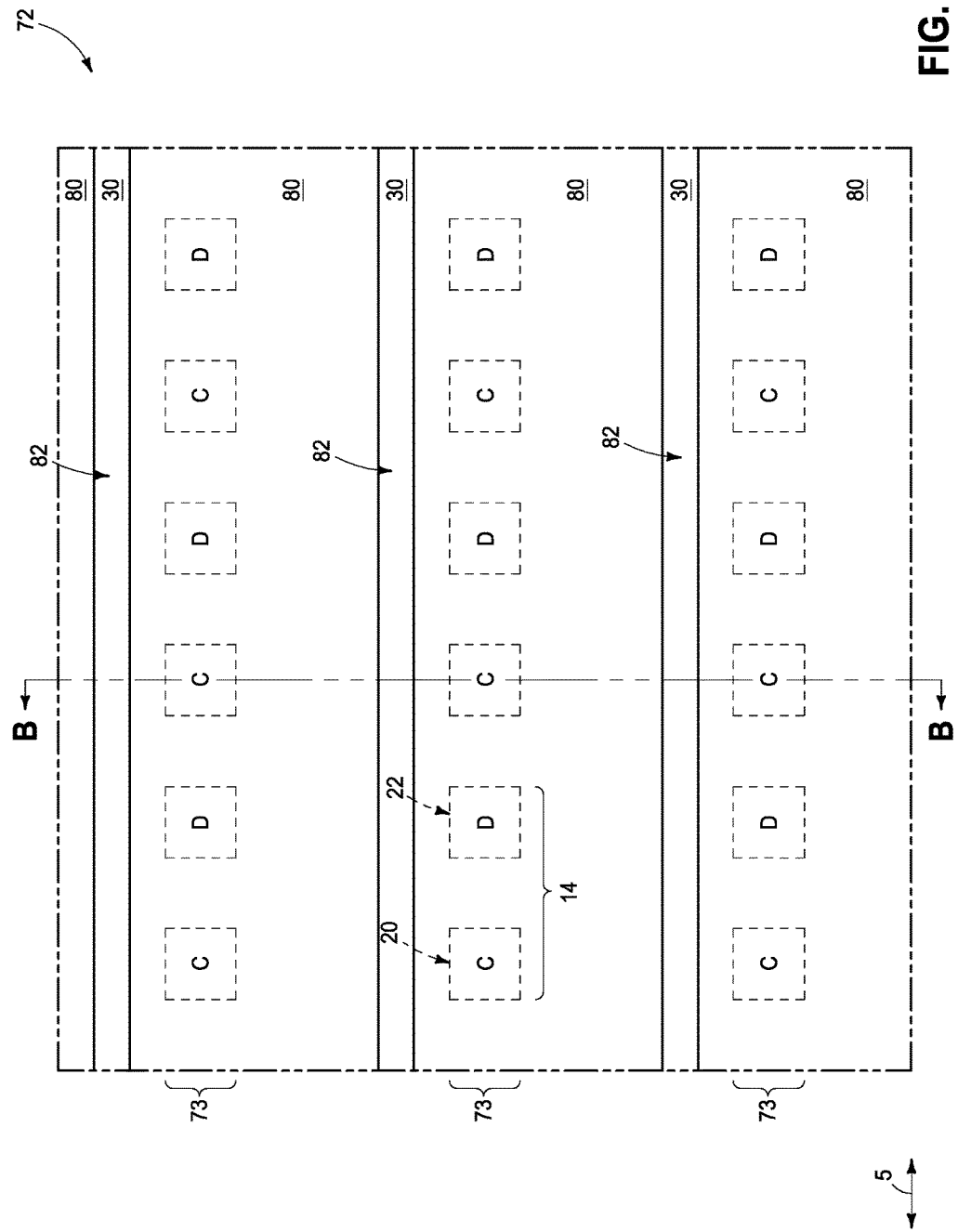
Figure 8:
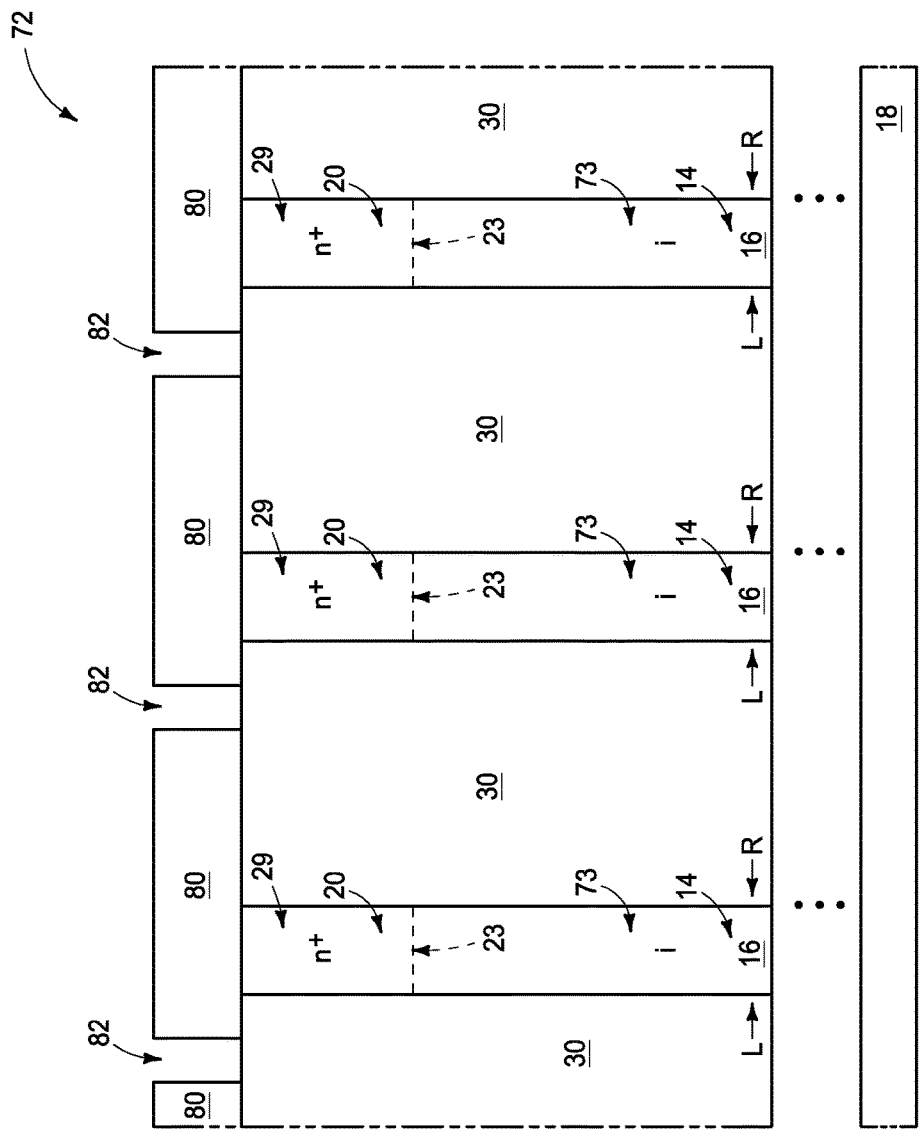

Referring to FIGS. 7 and 8, trenches 82 are formed within the masking material 80. The trenches 82 are along the left sides (L) of the rows 73 of fins 14. The trenches 82 may be formed with any suitable processing, and may have any suitable width dimension. In some embodiments, each of the trenches 82 may be formed to have a width dimension of F/2, F/4, F/6, etc., where F is a minimum feature size of a photolithographic process utilized during fabrication of the trenches 82.

The trenches 82 extend along a direction of an axis 5 (shown proximate the top view of FIG. 7). Such direction may correspond to a row direction of a memory array ultimately formed from construction 72.

Figure 9:
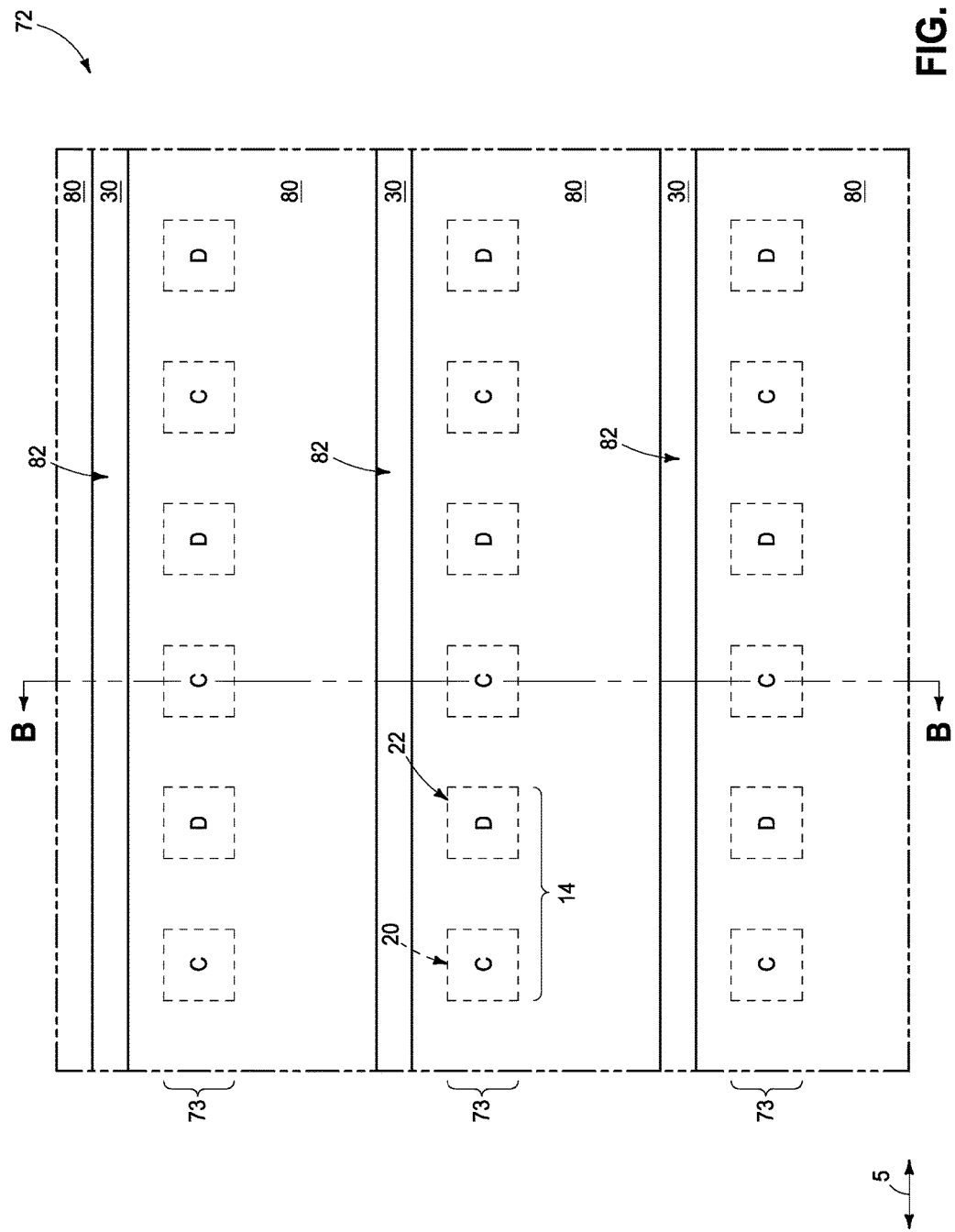
Figure 10:
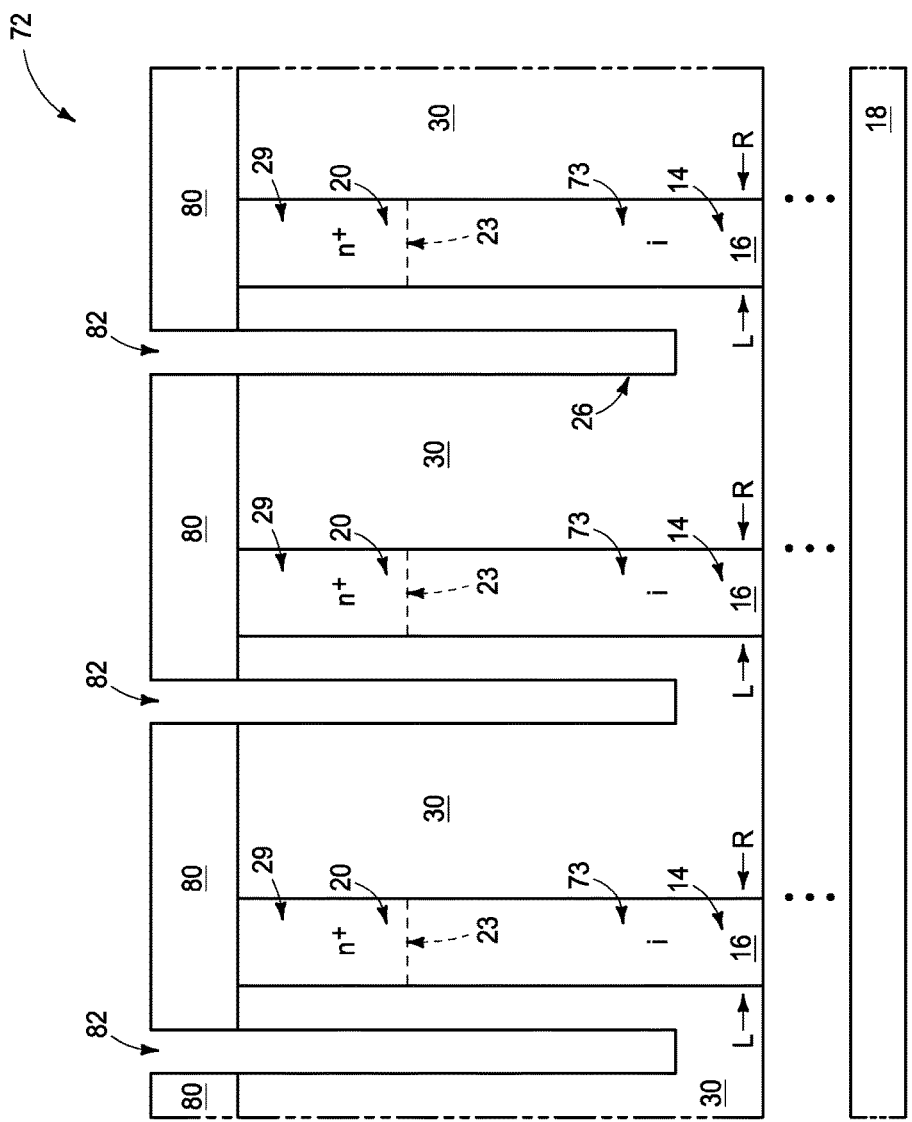

Referring to FIGS. 9 and 10, trenches 82 are extended into dielectric material 30 utilizing one or more etches.

Figure 11:
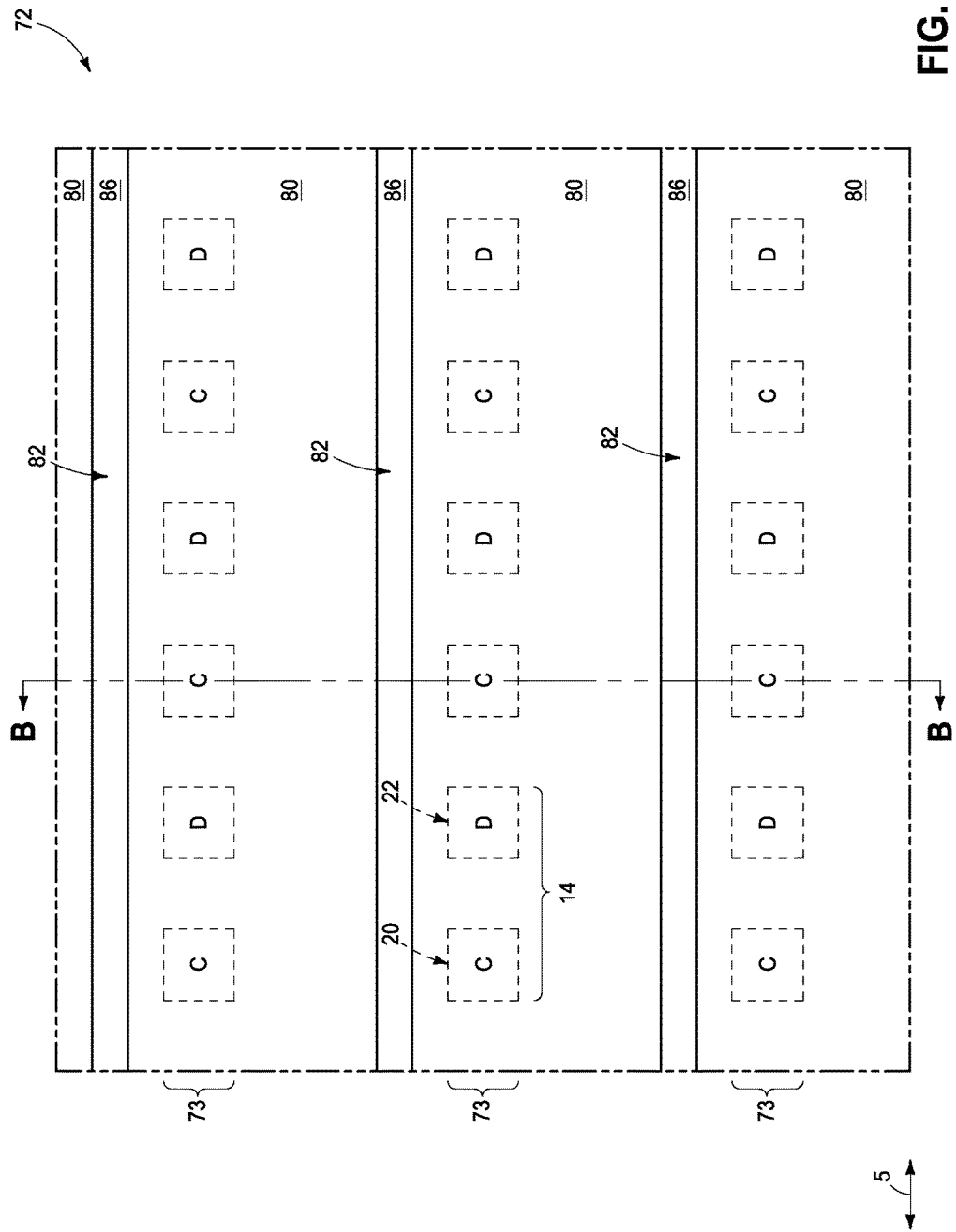
Figure 12:
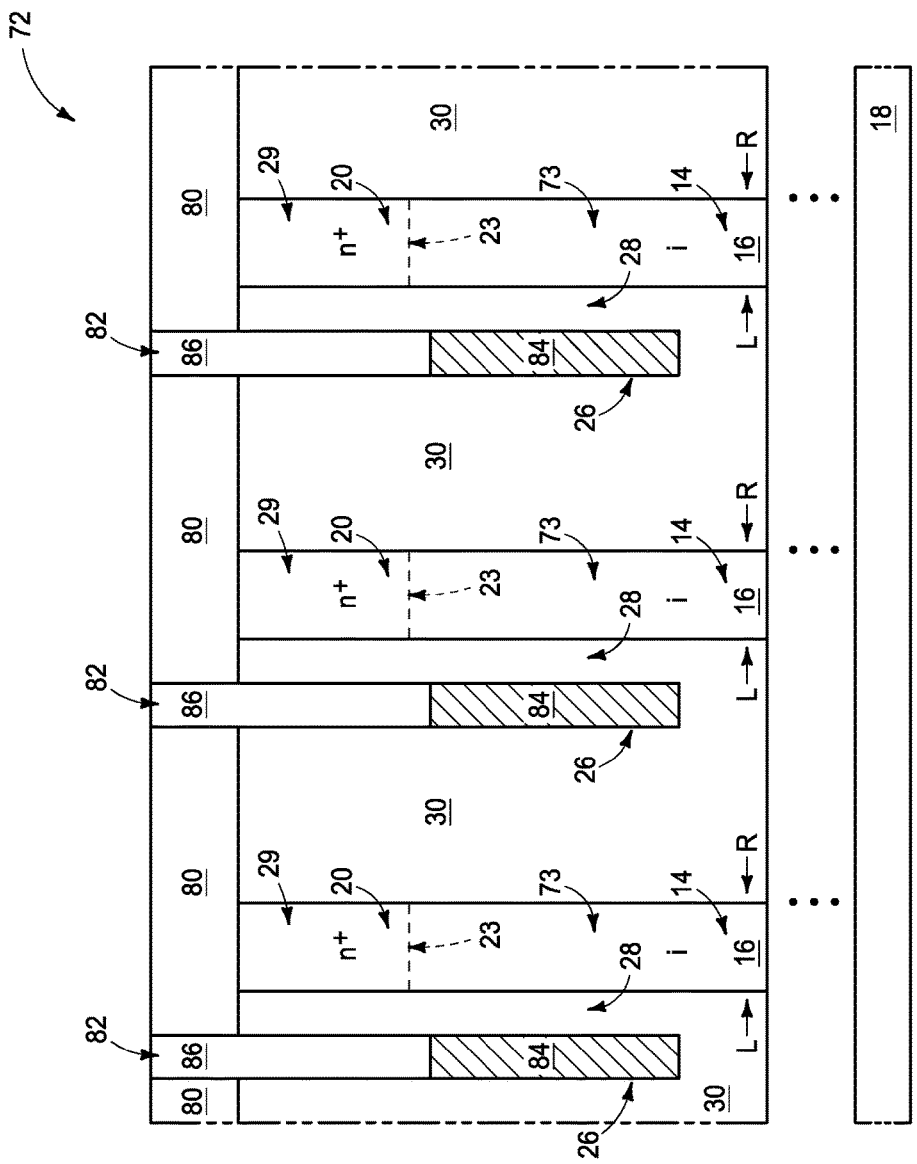

Referring to FIGS. 11 and 12, wordline material 84 is formed at the bottom of trenches 82, and insulative material 86 is formed over the wordline material 84.

The wordline material 84 is configured as a plurality of wordlines 26 along the left sides (L) of the rows 73 of fins 14, and may comprise any of the conductive materials discussed above as being suitable for utilization in the wordlines 26.

The insulative material 86 may comprise any suitable composition or combination of compositions; including, for example, silicon dioxide, silicon nitride, etc. The insulative material 86 may comprise a same composition as the dielectric material 30, or may comprise a different composition relative to the dielectric material 30. In the illustrated embodiment the dielectric material 30 between the wordlines 26 and the fins 14 remains as gate dielectric material 28. In other embodiments the etching of trenches 82 may expose sidewall regions of fins 14, and such regions may be oxidized to form the gate dielectric material 28. Additionally, or alternatively, gate dielectric material 28 may be deposited within trenches 82 along exposed sidewalls of fins 14.

Figure 13:
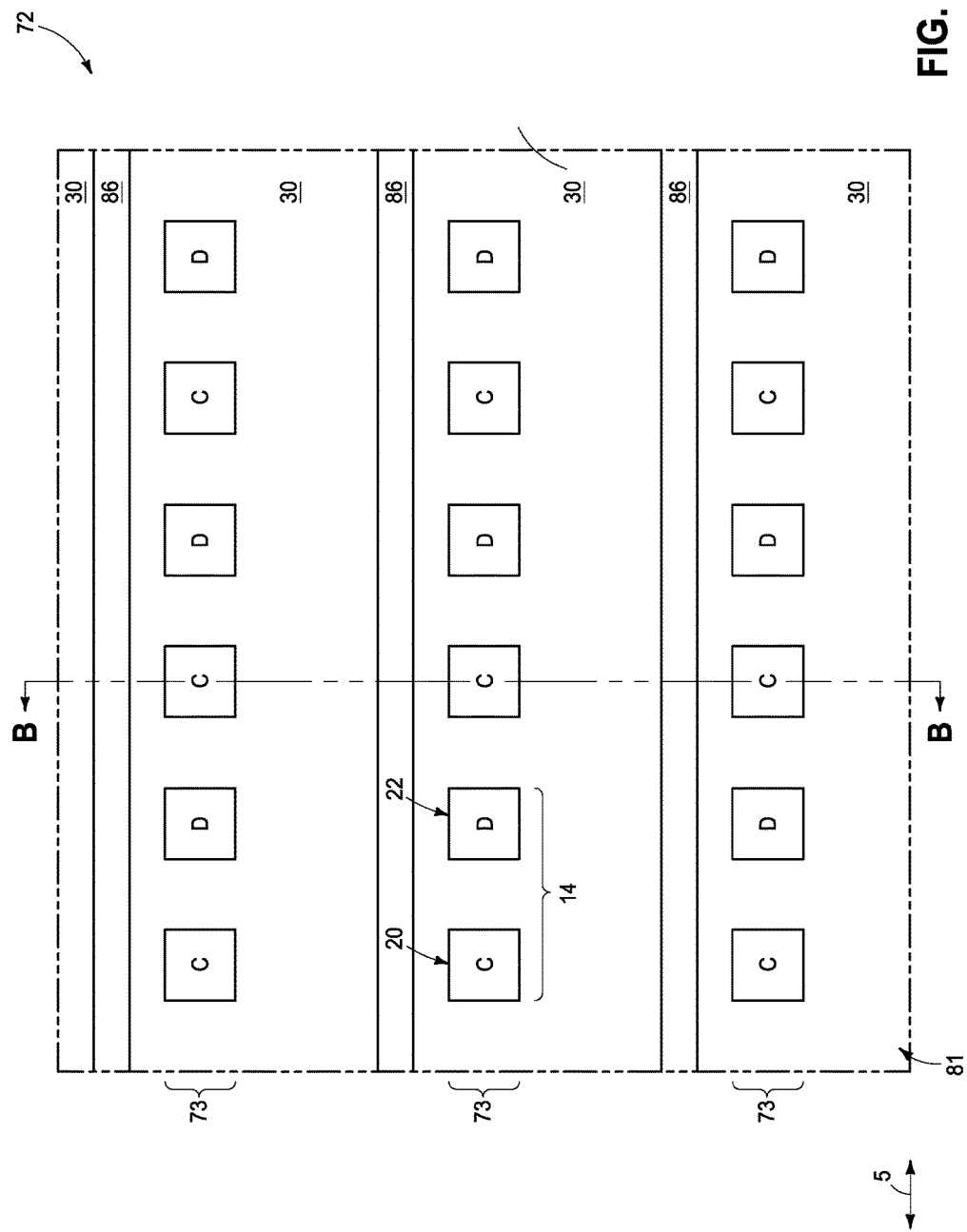
Figure 14:
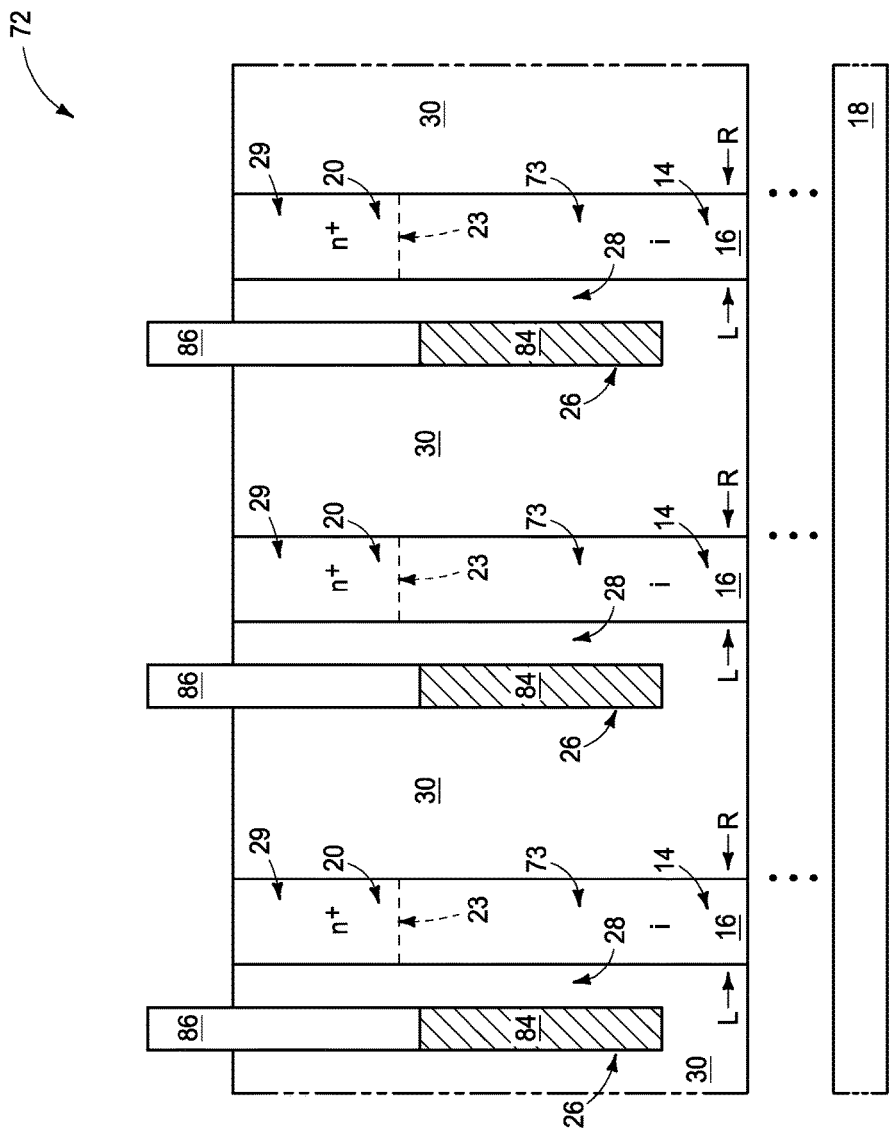

Referring to FIGS. 13 and 14, the masking material 80 (FIGS. 11 and 12) is removed to leave an upper surface 81 comprising dielectric material 30, semiconductor material 16 of the projections 20 and 22 of fins 14, and insulative material 86.

Figure 15:
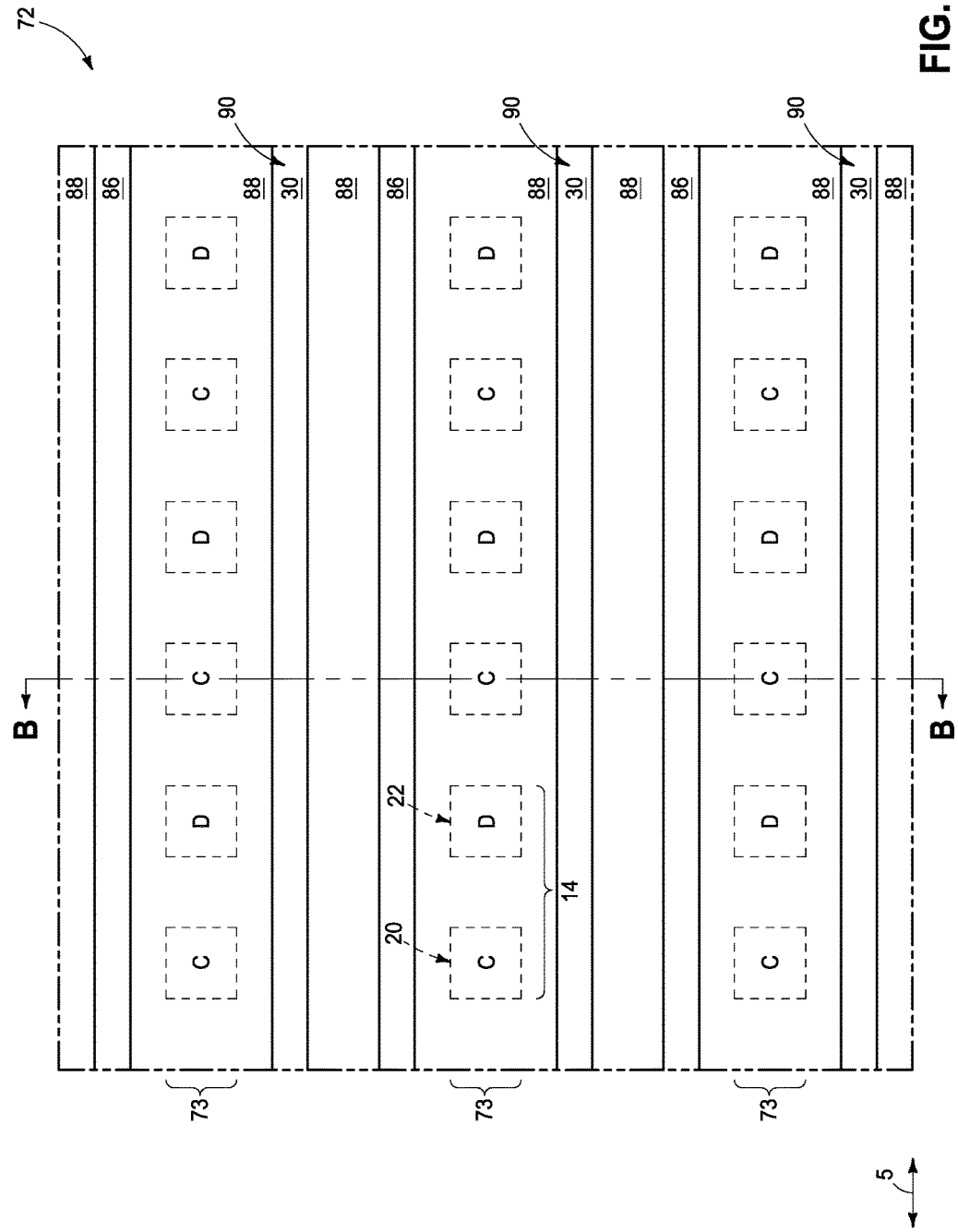
Figure 16:
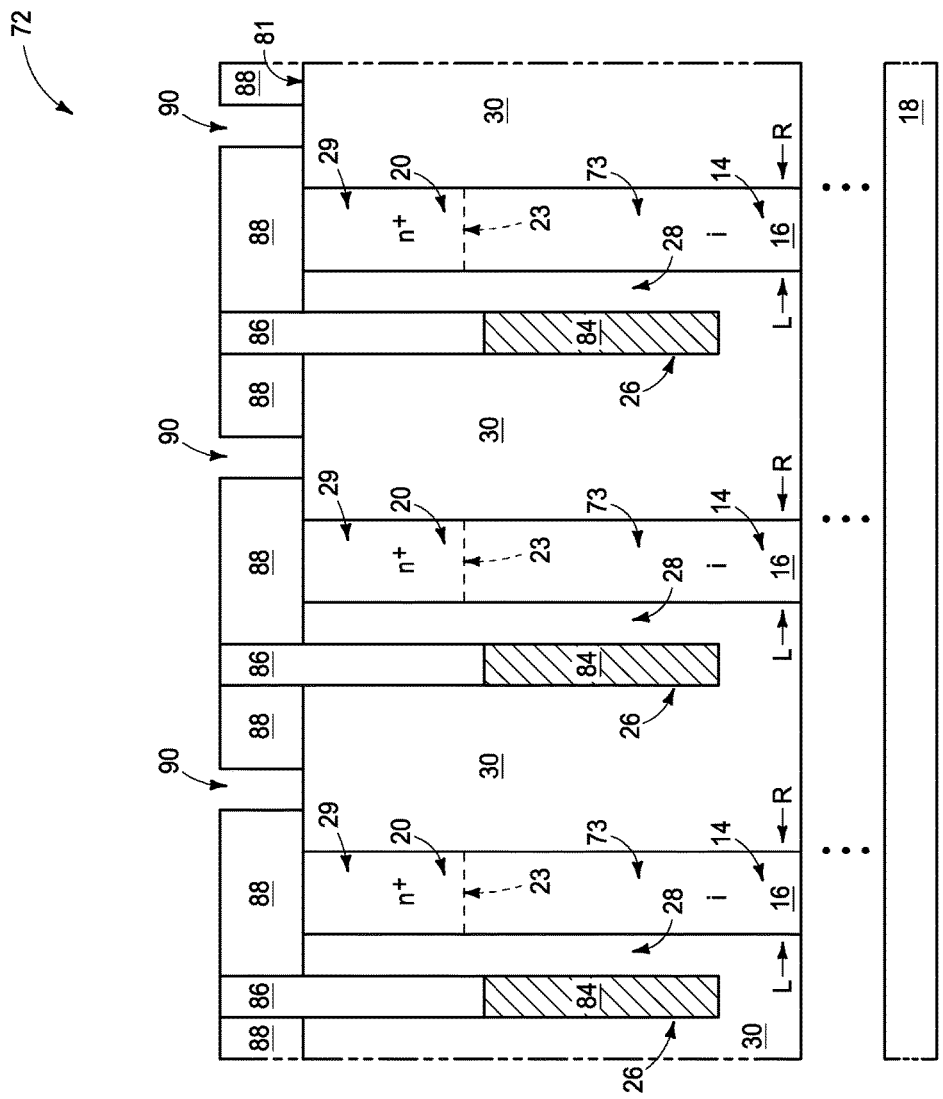

Referring to FIGS. 15 and 16, masking material 88 is formed across the surface 81 and patterned to have trenches 90 extending therethrough. The masking material 88 may comprise a same composition as the masking material 80 described above with reference to FIGS. 5 and 6, or may comprise a different composition than the masking material 80. In the illustrated embodiment the masking material 88 does not extend across upper surfaces of insulative material 86. In such embodiment, the masking material 88 may include a spacer aligned with exposed sidewall surfaces of insulative material 86 in order to align the trenches 90 in a desired location relative to the rows 73 of fins 14. In other embodiments the masking material 88 may extend across the upper surfaces of insulative material 86, and may be patterned with lithographic and/or other suitable methodology to form the trenches 90.

The trenches 90 are along the right sides of the rows 73 of fins 14, and extend along the row direction of axis 5. In some embodiments, each of the trenches 90 may be formed to have a width dimension of F/2, F/4, F/6, etc., where F is a minimum feature size of a photolithographic process utilized during fabrication of the trenches 90.

Figure 17:
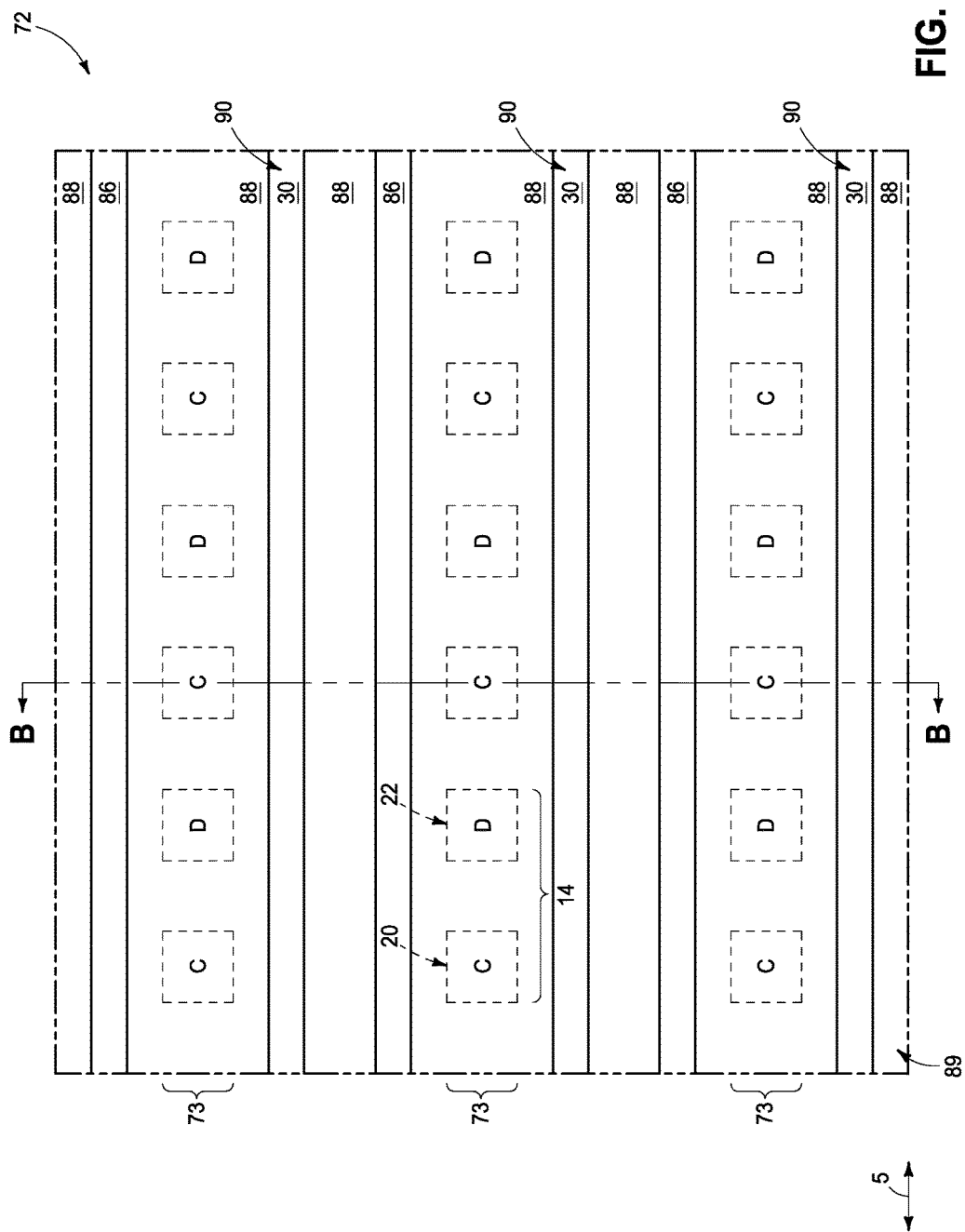
Figure 18:
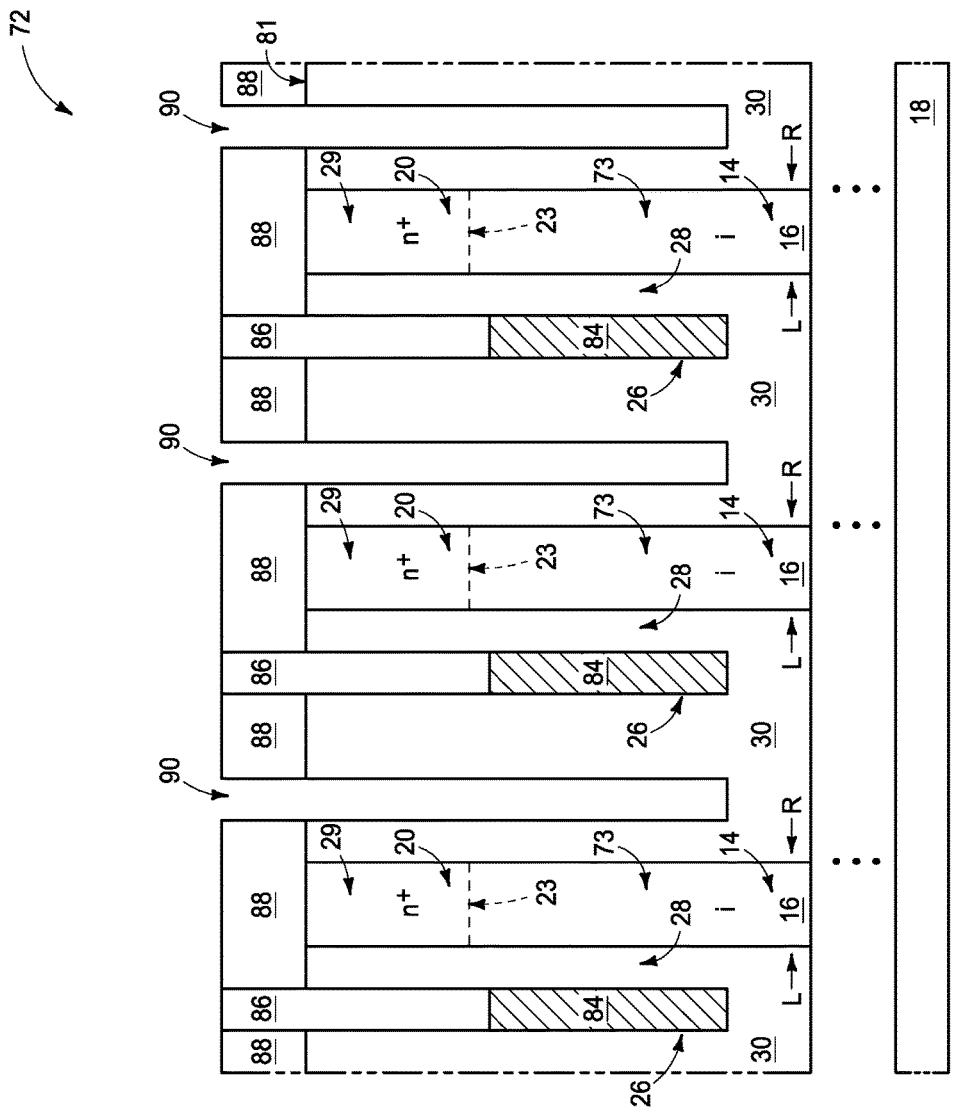

Referring to FIGS. 17 and 18, the trenches 90 are extended into dielectric material 30 with one or more suitable etches.

Figure 19:
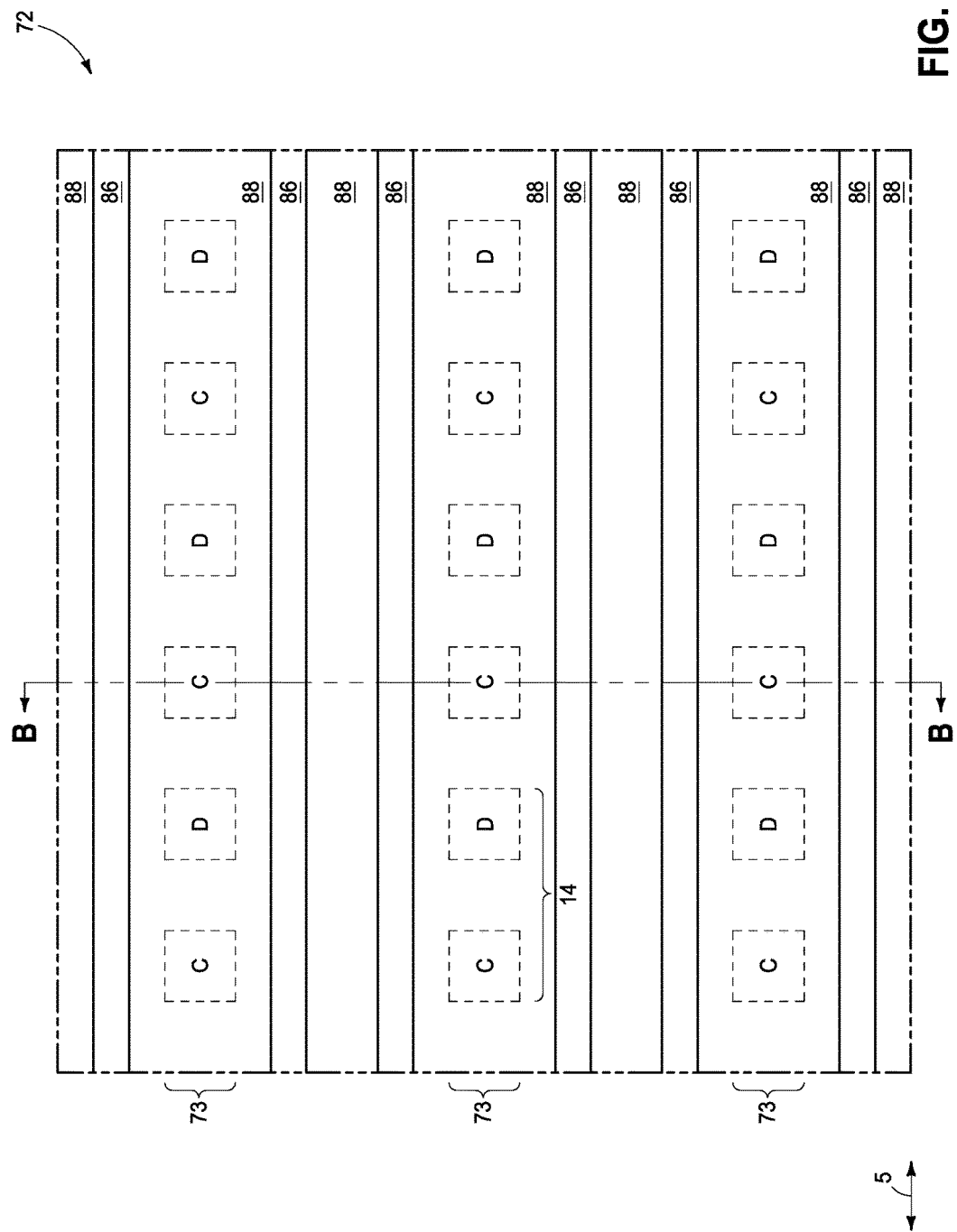
Figure 20:
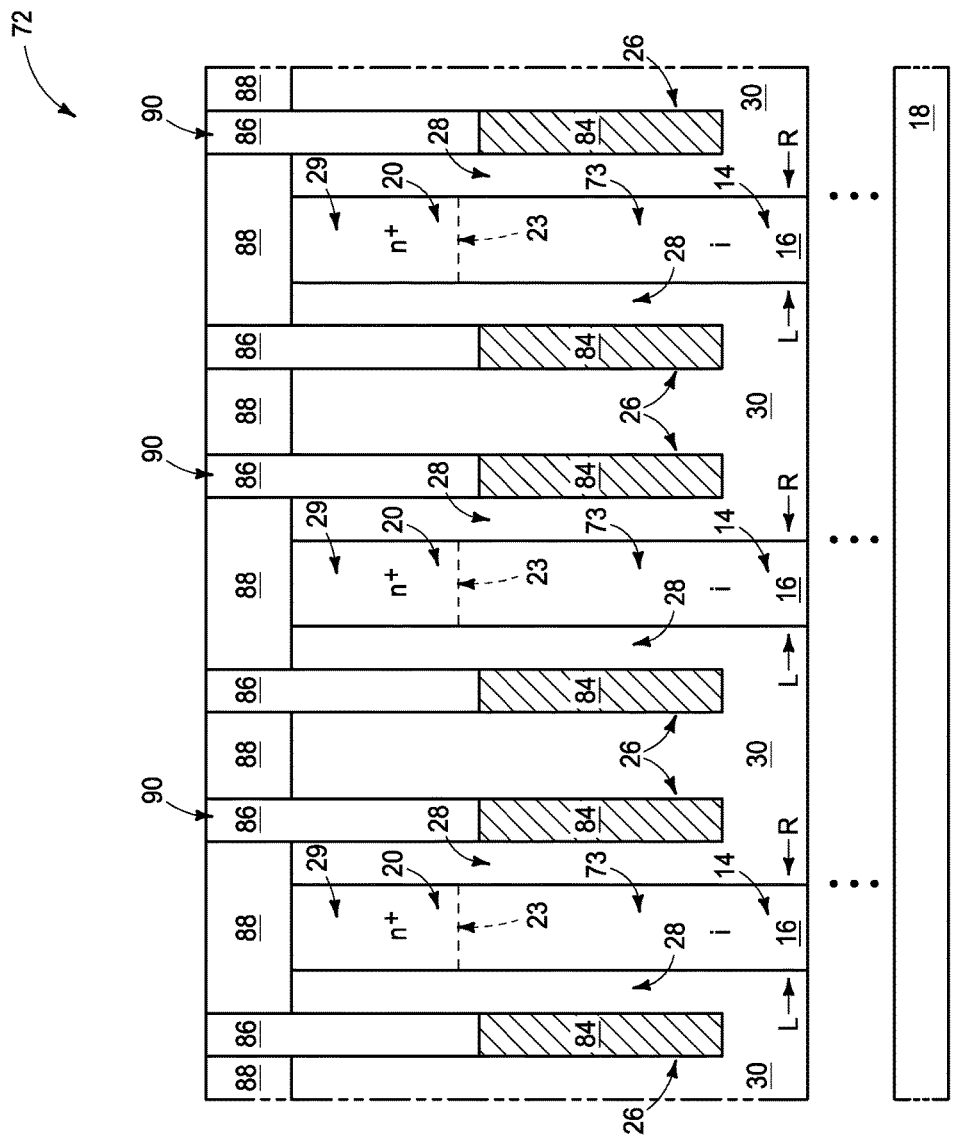

Referring to FIGS. 19 and 20, wordline material 84 is formed at the bottom of trenches 90, and insulative material 86 is formed over the wordline material 84.

The wordline material 84 within trenches 90 is configured as a plurality of wordlines 26 along the right sides (R) of the rows 73 of fins 14.

In the illustrated embodiment the dielectric material 30 remains as gate dielectric material 28 along the right sides (R) of fins 14. In other embodiments the etching of trenches 90 may expose sidewall regions along the right sides (R) of fins 14, and such regions may be oxidized to form the gate dielectric material 28. Additionally, or alternatively, gate dielectric material 28 may be deposited within trenches 90 along exposed sidewalls of fins 14.

Although the same materials 84 and 86 are formed within trenches 90 as had been formed within trenches 82 (FIGS. 11 and 12), in other embodiments different materials may be formed in the trenches 90 of FIGS. 19 and 20 than are formed in the trenches 82 of FIGS. 11 and 12.

The embodiment of FIGS. 5-20 forms the wordlines 26 on the right sides of the rows 73 of fins 14 after forming the wordlines 26 on the left sides of the rows 73 of fins 14. In contrast, conventional methods may expose both sides of a row of fins, and then form the wordlines on the left and right sides of the row simultaneously. A problem with such conventional methods is that a row of fins may be tall and narrow, and accordingly subject to toppling. The methodology of FIGS. 5-20 advantageously forms a wordline on one side of the row of fins sequentially relative to the formation of the wordline on the other side of the row of fins. Such may avoid fin toppling problems associated with conventional methods.

Figure 21:
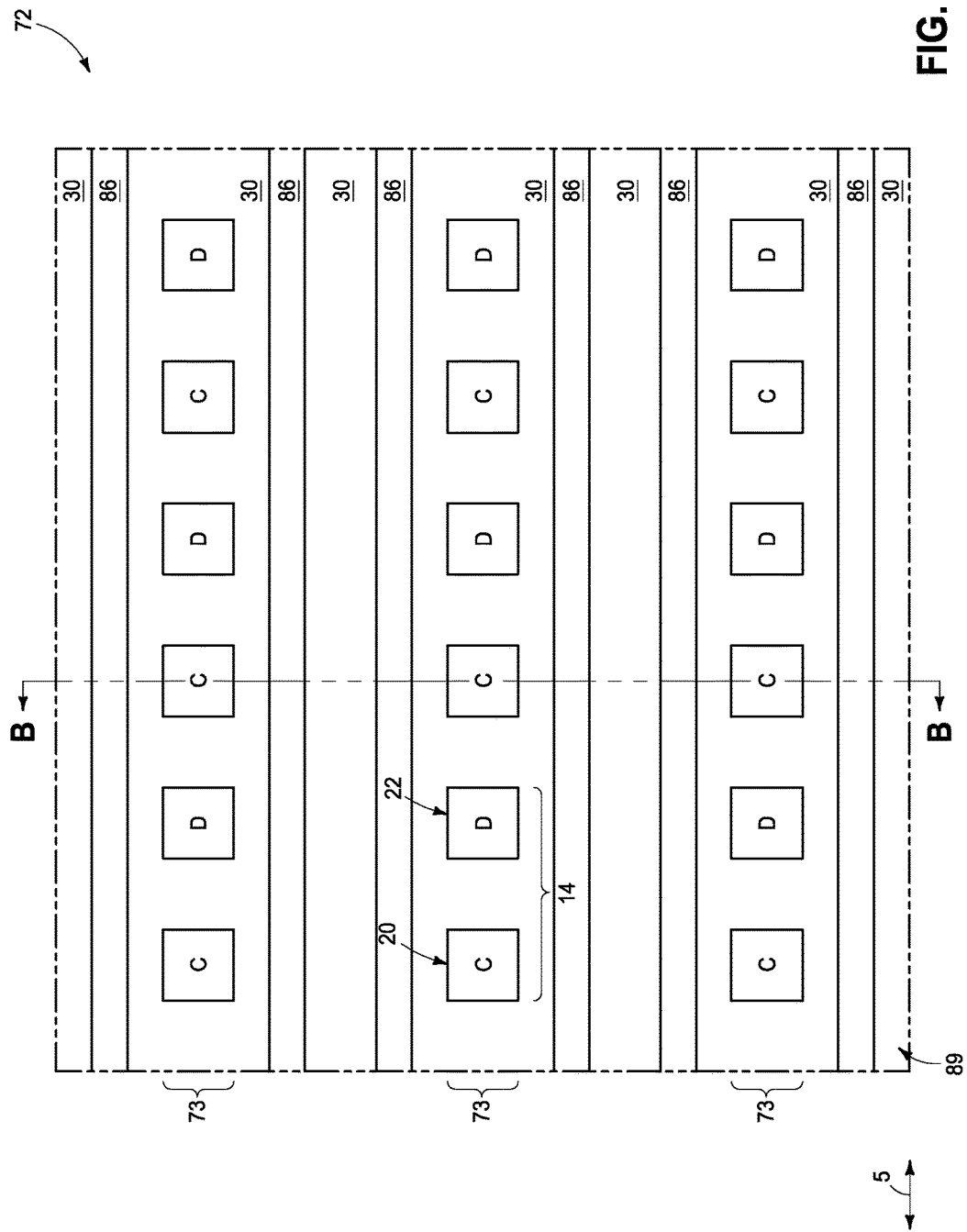
Figure 22:
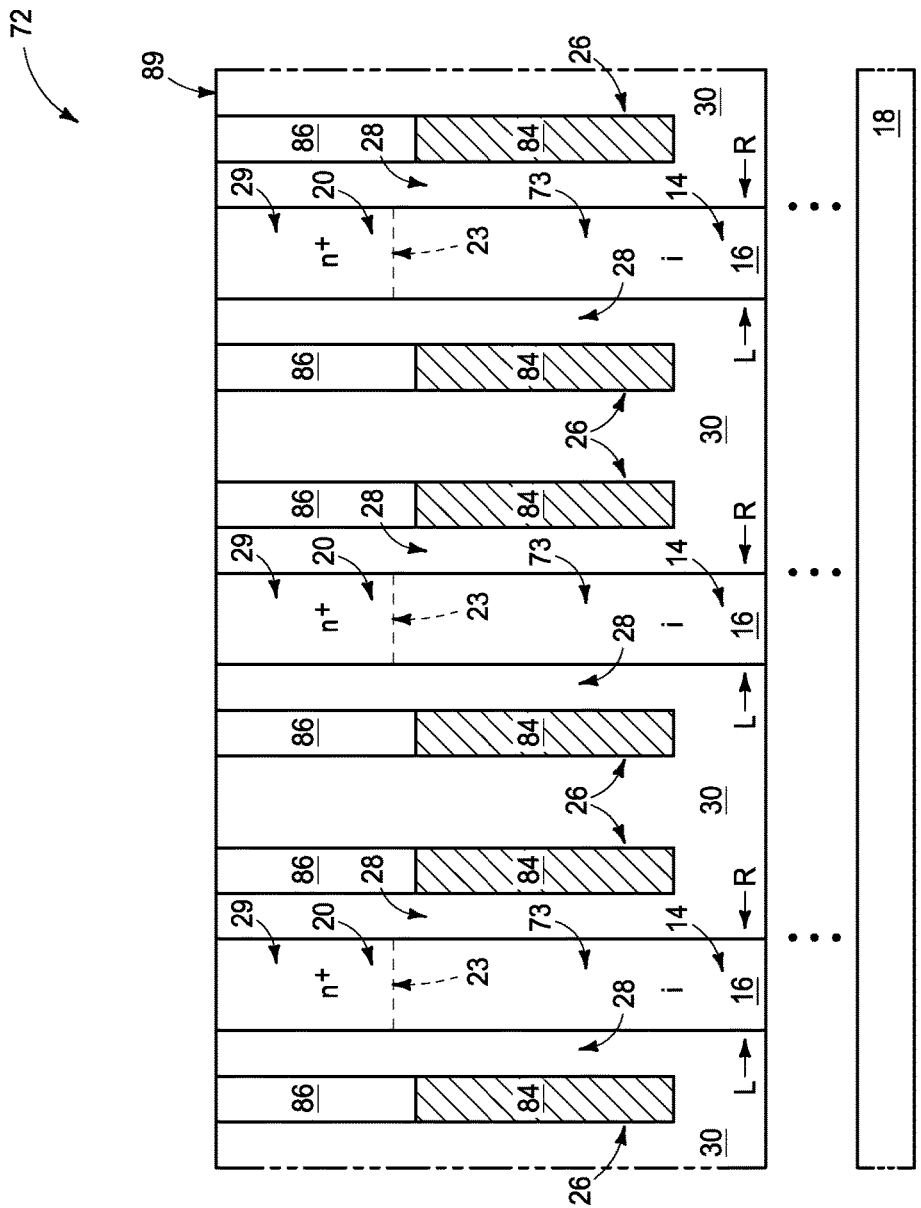

Referring to FIGS. 21 and 22, the masking material 88 (FIGS. 19 and 20) is removed, and construction 72 is subjected to planarization to form the planarized upper surface 89. The planarization may utilize any suitable methodology, including, for example, chemical-mechanical polishing (CMP).

Figure 23:
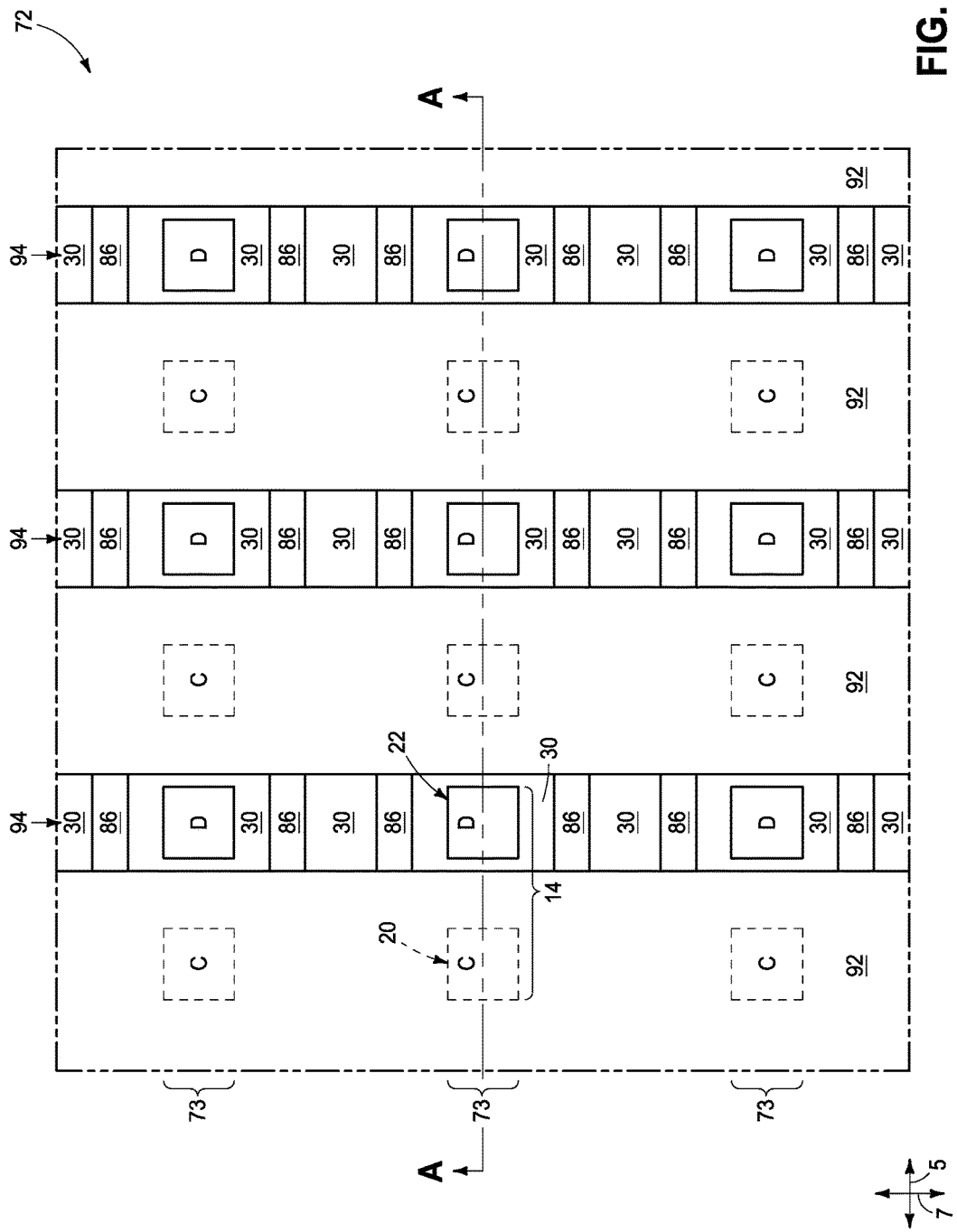

Referring to FIGS. 23 and 24, patterned masking material 92 is formed across the planarized surface 89. The masking material 92 may comprise any suitable composition or combination of compositions; including, for example, one or more of the compositions described above with reference to masking material 80 of FIGS. 5 and 6.

The patterned masking material has trenches 94 extending therethrough. Such trenches extend along a direction of an axis 7. Such direction may correspond to a column direction of a memory array ultimately formed from construction 72. The column direction of axis 7 is substantially orthogonal to the row direction of axis 5; with the term "substantially orthogonal" meaning orthogonal to within reasonable tolerances of fabrication and measurement.

The trenches 94 may be formed with any suitable processing, and may have any suitable width dimension; such as, for example, F/2.

Figure 25:
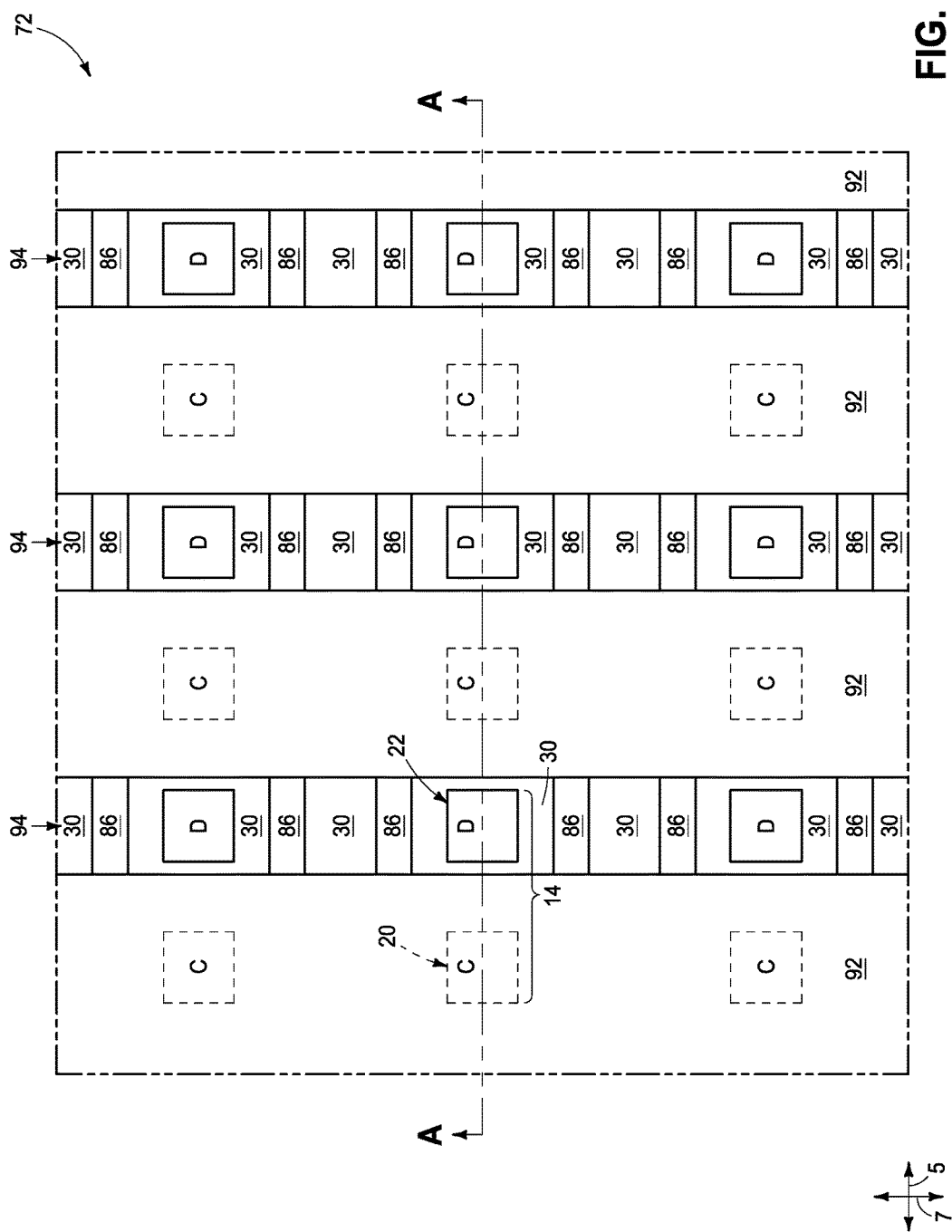
Figure 26:
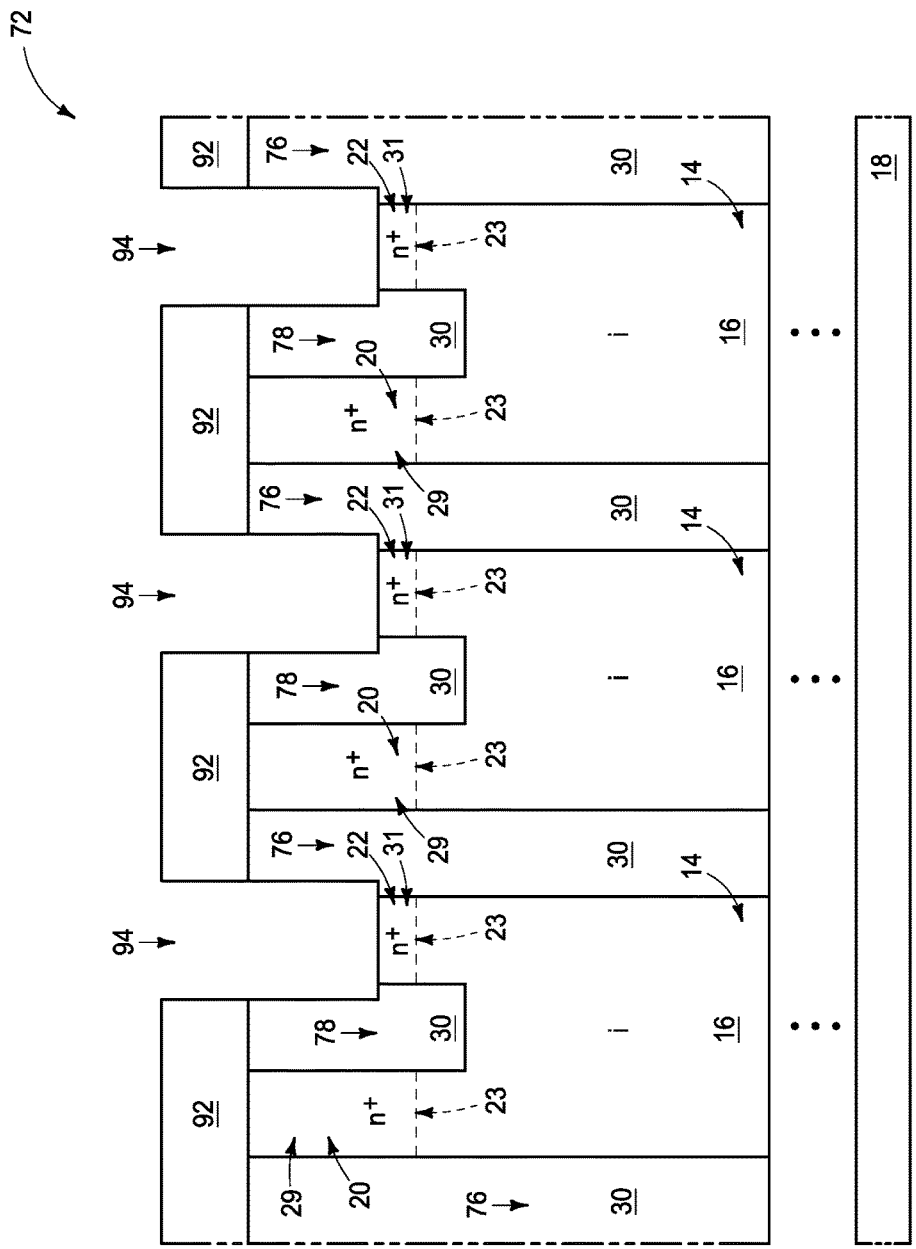

Referring to FIGS. 25 and 26, the trenches 94 are extended into underlying materials. Such reduces a height of the pedestals 22 of the fins 14 relative to the height of the pedestals 20 of the fins 14.

Figure 27:
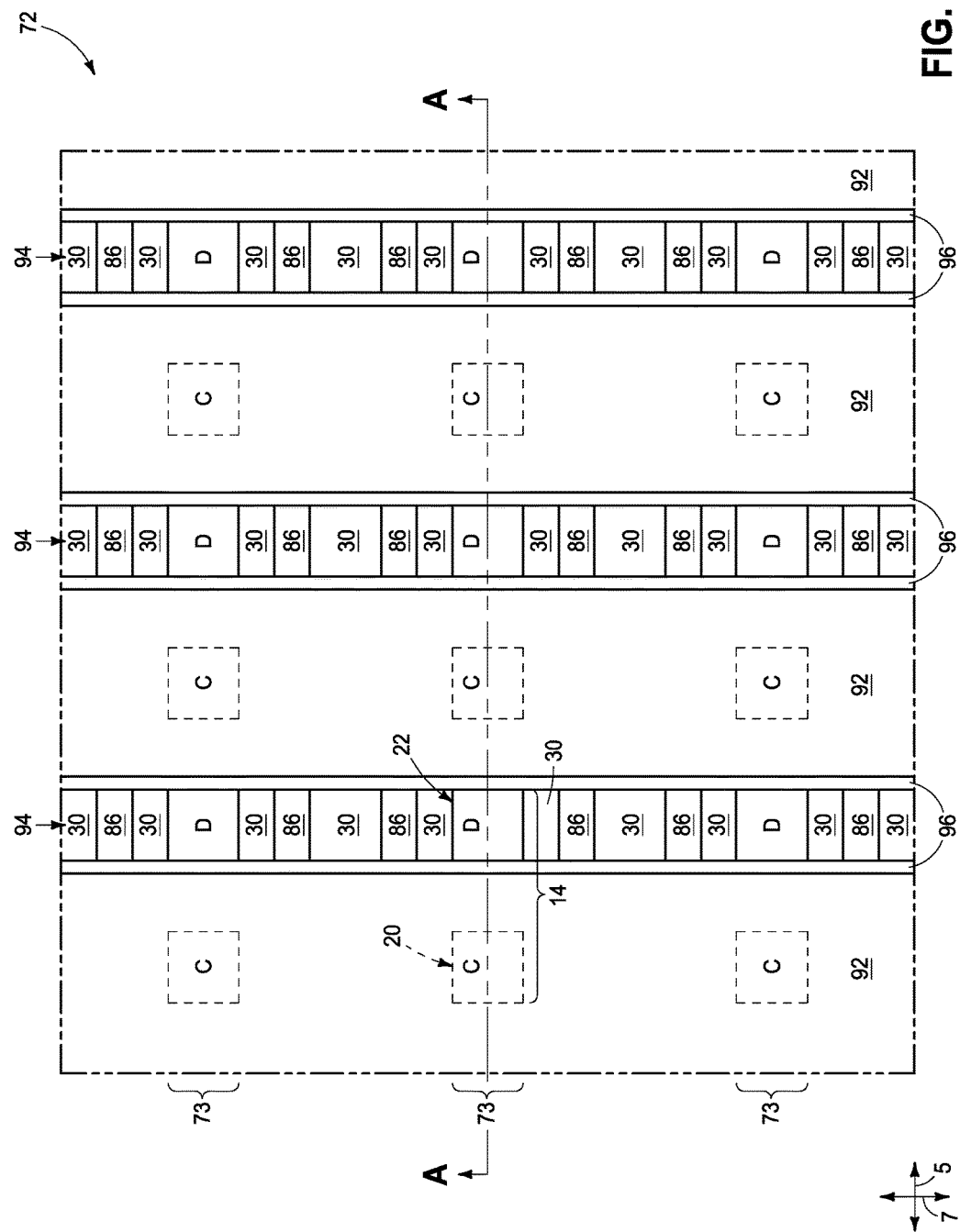
Figure 28:
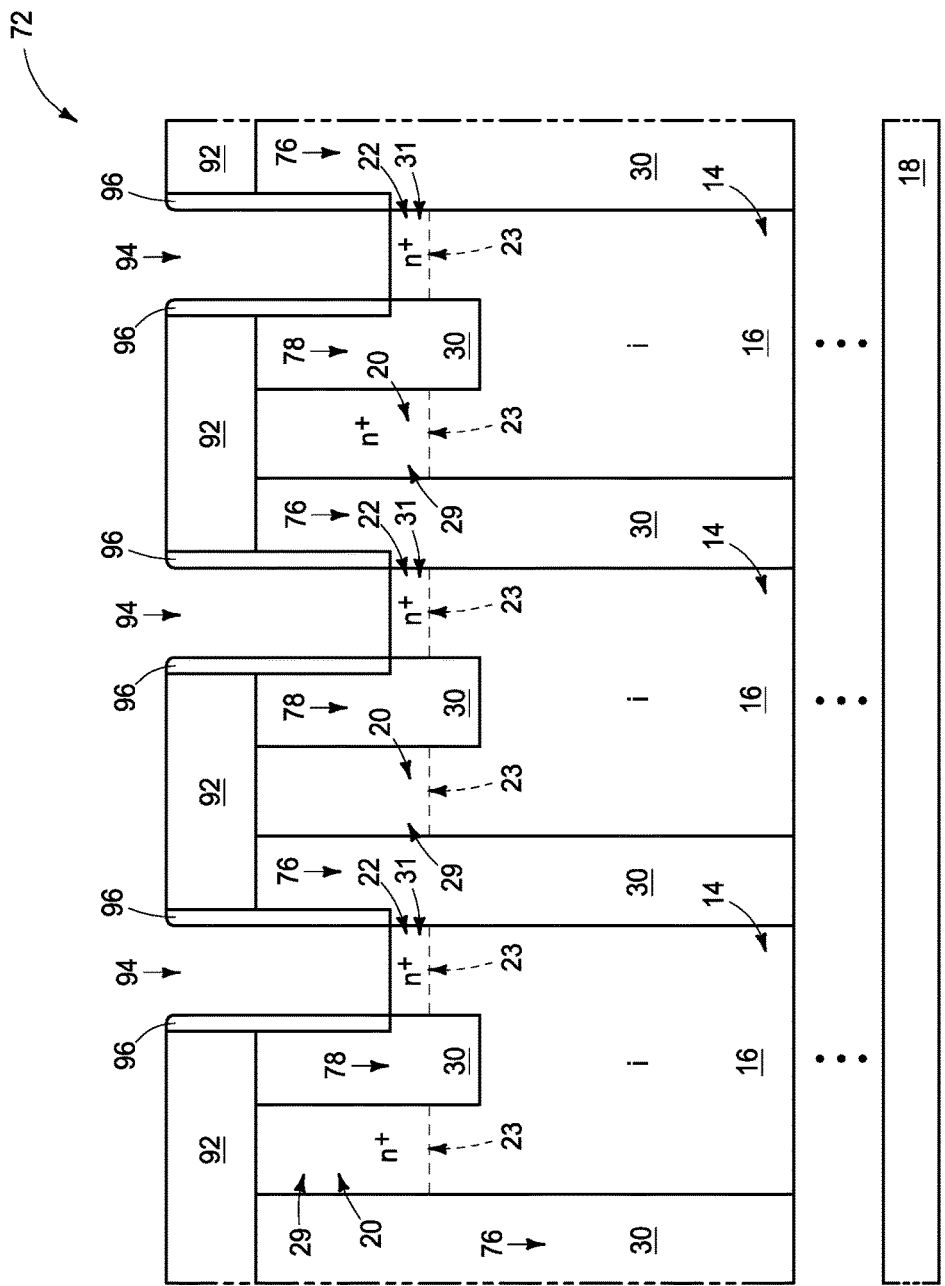

Referring to FIGS. 27 and 28, spacer material 96 is formed along the sidewalls of trenches 94 and patterned into spacers. The spacer material 96 may be patterned utilizing any suitable methodology. For instance, the spacer material 96 may be formed to extend conformally along an upper surface of construction 72, and then removed from the horizontal surfaces utilizing anisotropic etching so that the spacer material remains along the vertical surfaces within trenches 94 as the illustrated spacers.

The spacer material 96 may comprise any suitable electrically insulative composition or combination of compositions; such as, for example, silicon nitride, silicon dioxide, etc.

The spacers of material 96 may be provided to protect digit line material (described below with reference to FIGS. 29 and 30) from shorting to other materials in the event of mask misalignment. In some embodiments such spacers may be omitted.

Figure 29:
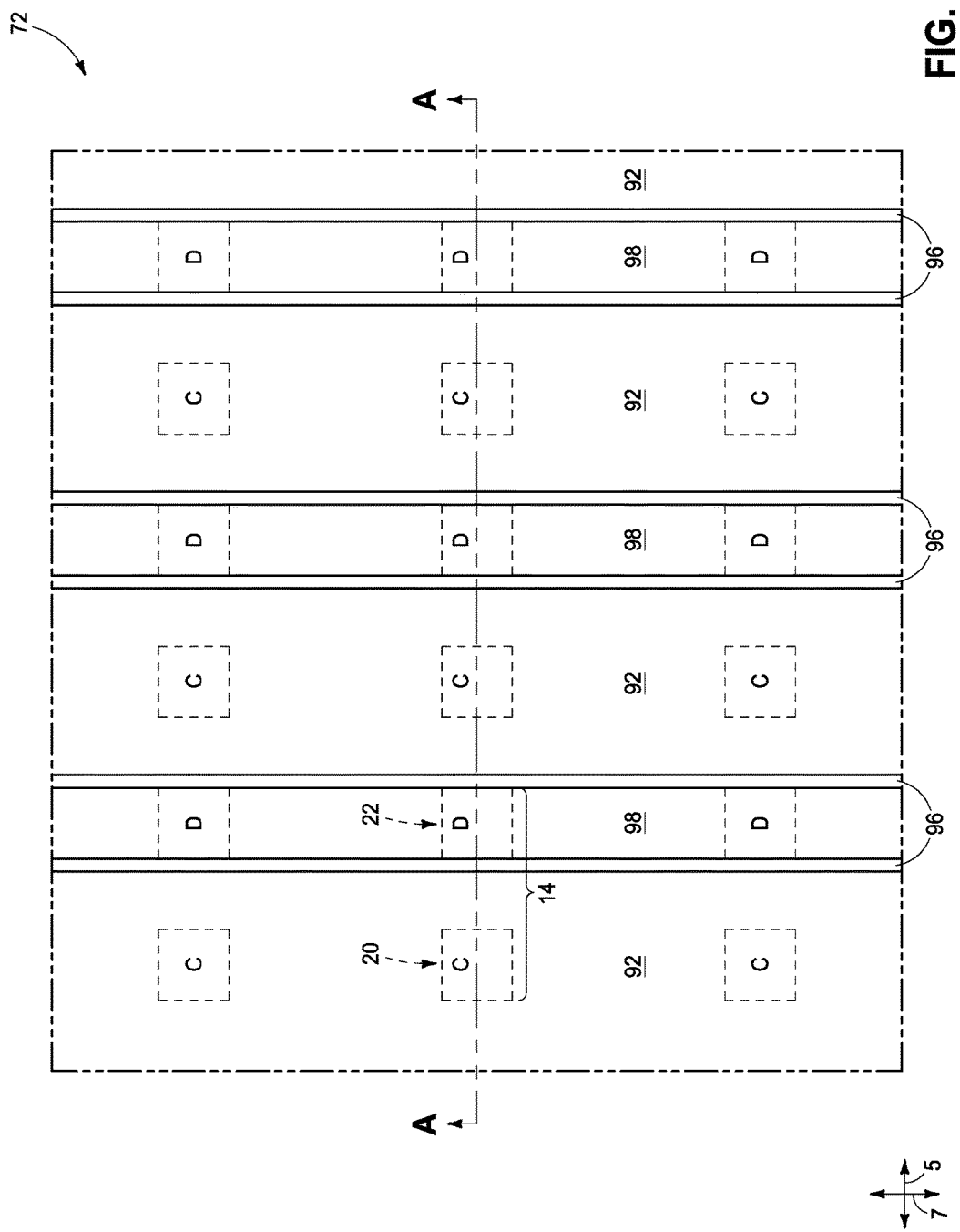
Figure 30:
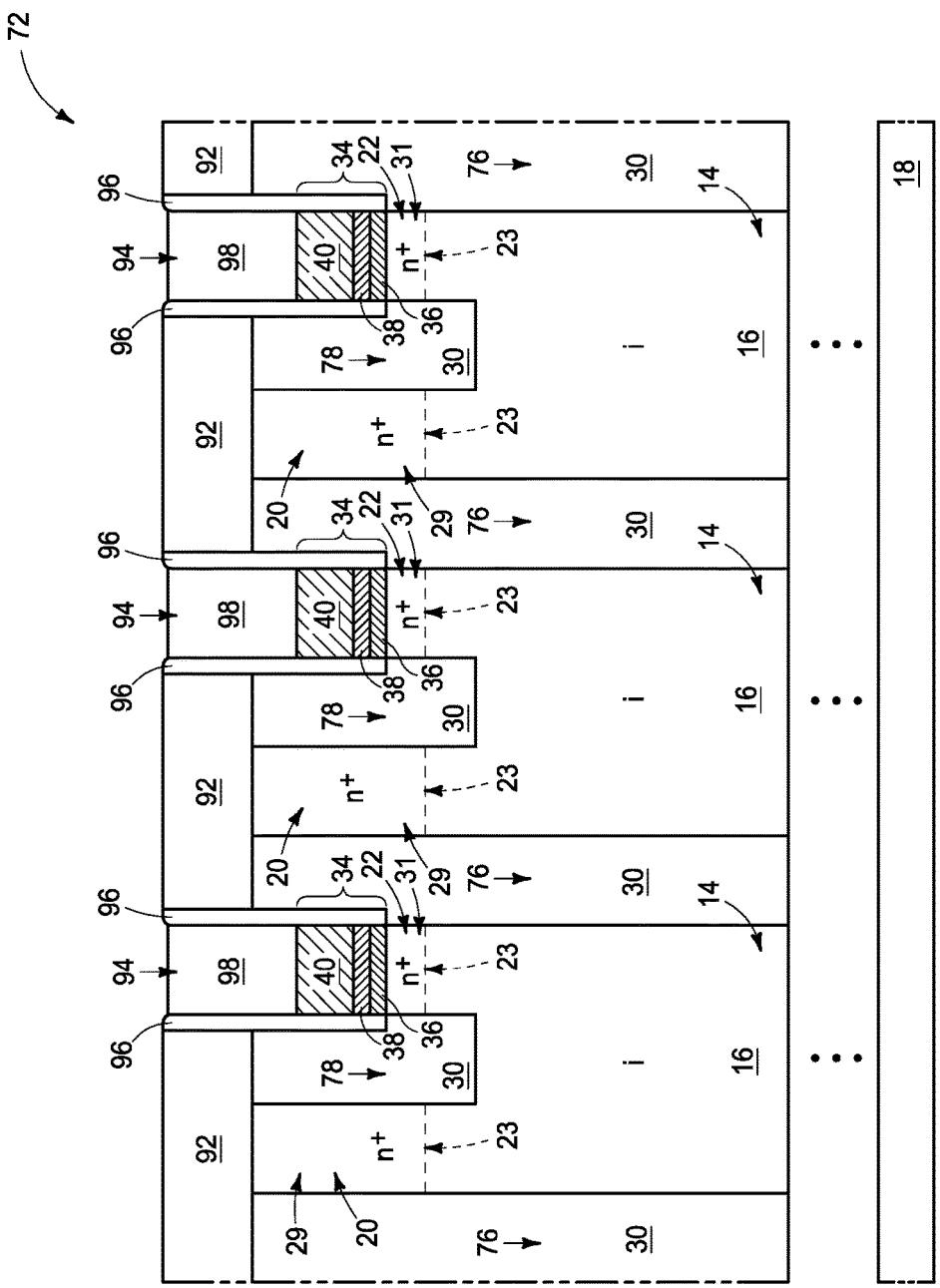

Referring to FIGS. 29 and 30, the digit line materials 36, 38 and 40 are formed within the trenches 94 to form digit lines 34. In the shown embodiment insulative material 98 is formed within the trenches 94 over the digit lines 34. The insulative material 98 may comprise any suitable composition or combination of compositions including, for example, one or more of silicon dioxide, silicon nitride, etc. The insulative material 98 may comprise a same composition as dielectric material 30 in some embodiments, and may be a different composition than dielectric material 30 in other embodiments.

Figure 31:
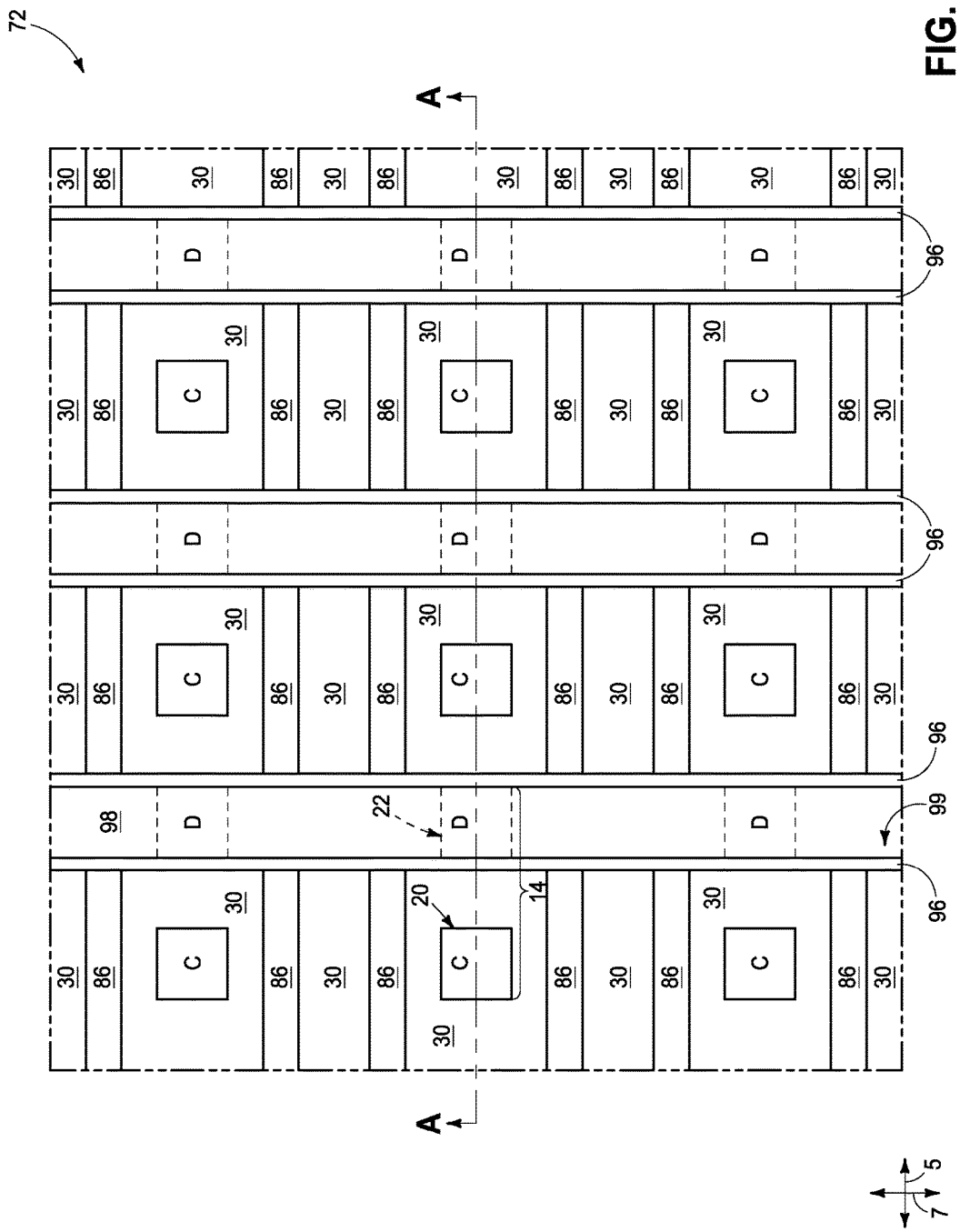
Figure 32:
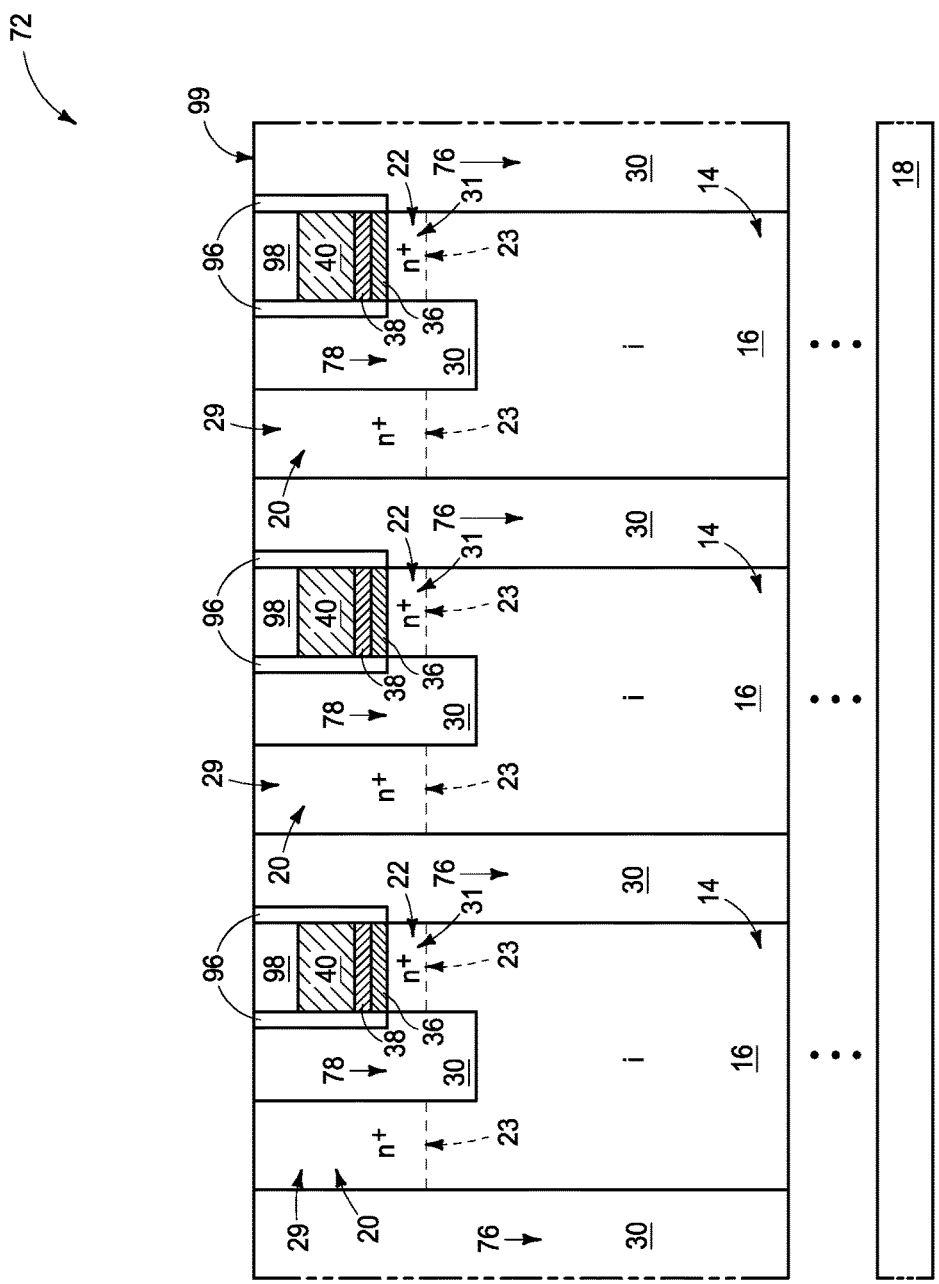

Referring to FIGS. 31 and 32, construction 72 is subjected to planarization to form a planarized upper surface 99. The planarization may utilize any suitable methodology, including, for example, CMP.

Figure 33:
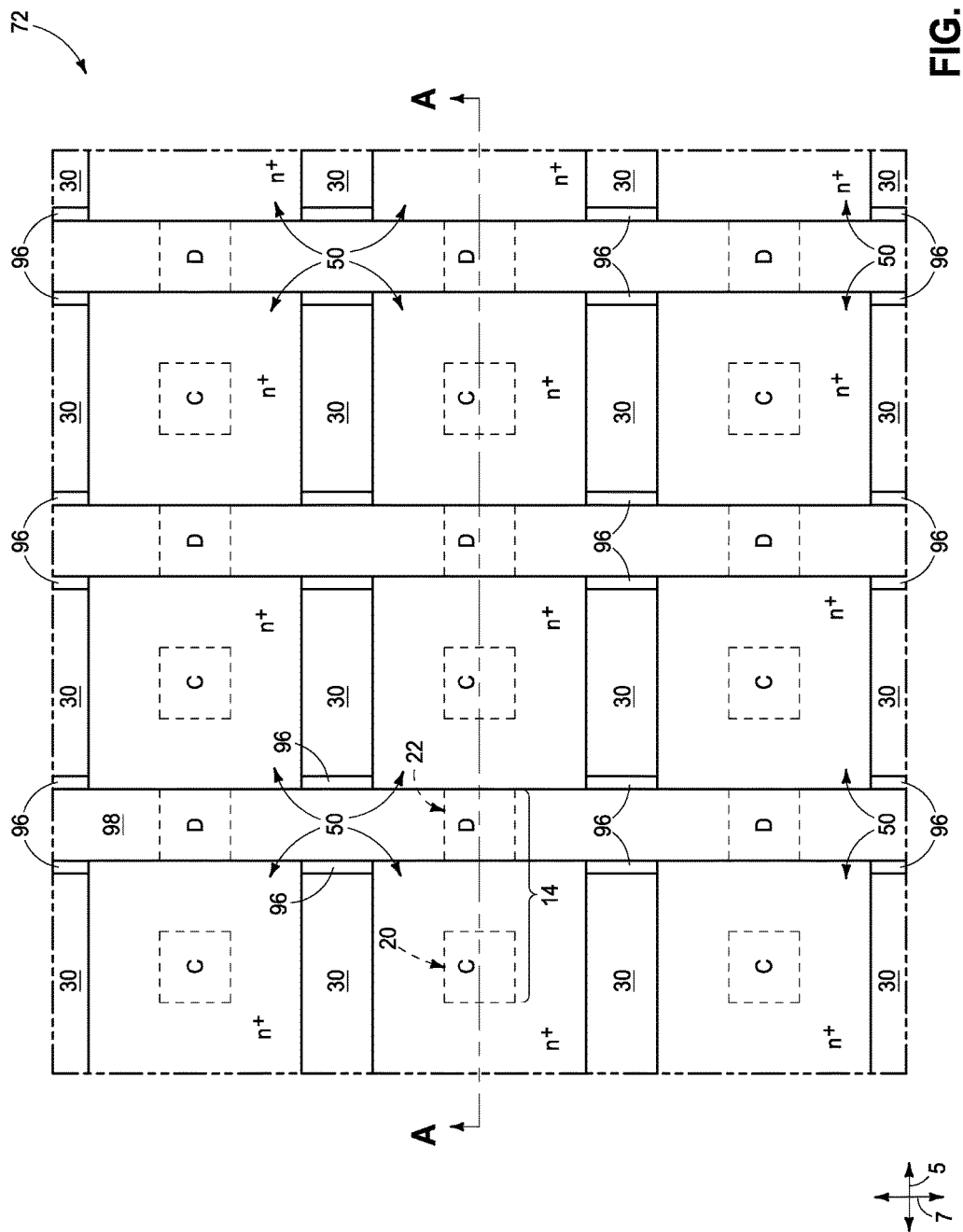
Figure 34:
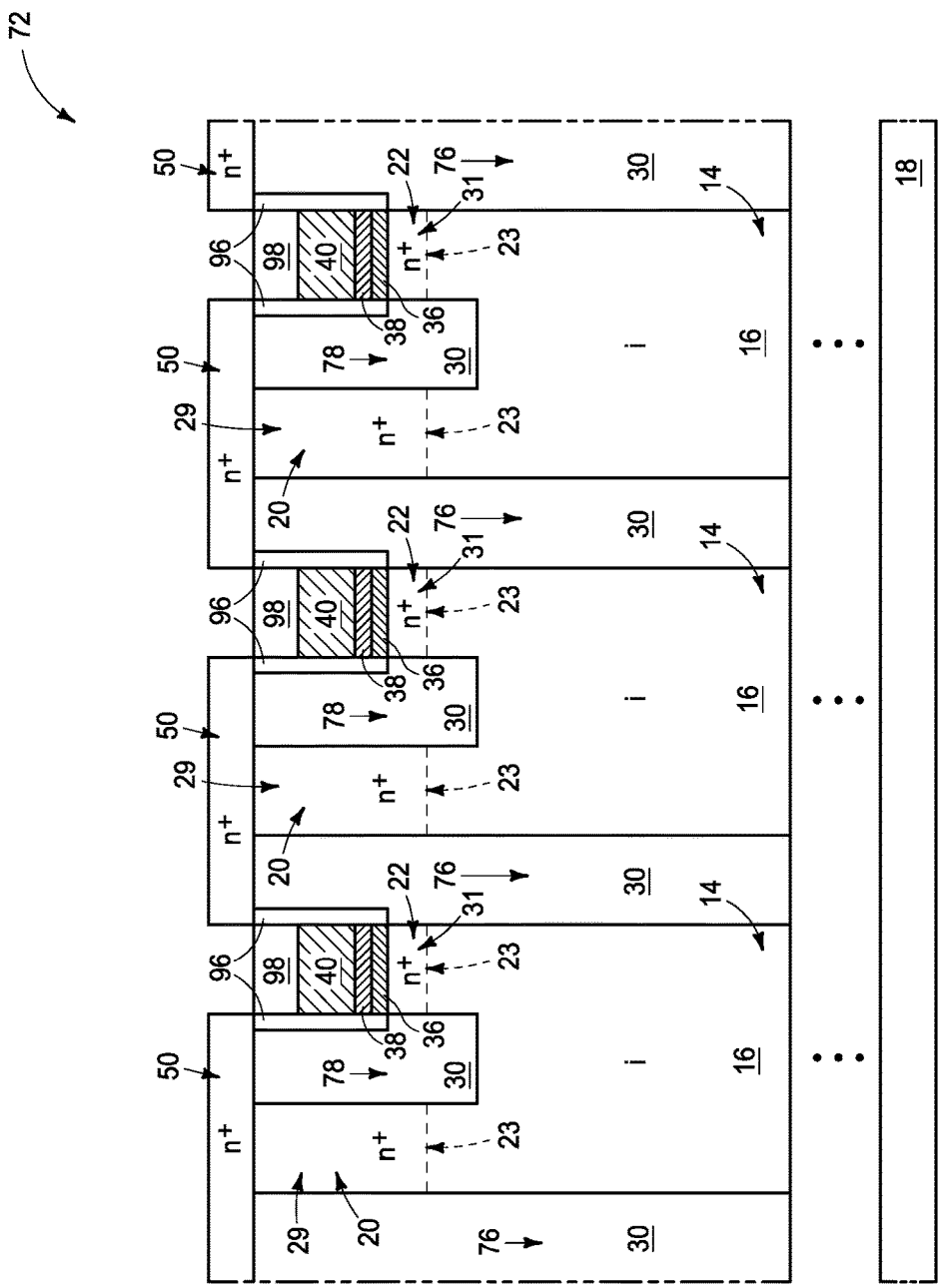

Referring to FIGS. 33 and 34, the conductively-doped pads 50 are formed over pedestals 20. The pads 50 may be formed utilizing any suitable processing. For instance, in some embodiments the pads 50 may be epitaxially grown over semiconductor material of pedestals 20, and in other embodiments at least portions of the pads may be deposited. In subsequent processing, capacitors 42 of the type described above with reference to FIGS. 1-3 may be formed over the pads 50 to thereby form a memory array 10 of the type described above with reference to FIGS. 1-3.

The various structures and architectures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory device comprising a memory array. The memory array includes a fin having a first source/drain region, a second source/drain region and a channel region between the first and second source/drain regions. The first source/drain region extends to a first height. The second source/drain region extends to a second height less than the first height. The channel region extends along a trough between the first and second source/drain regions. A charge-storage device is over the first source/drain region and is electrically coupled with the first source/drain region. A first sense/access line is along a sidewall of the fin and is spaced from the channel region by dielectric material. A second sense/access line is over the second source/drain region and is electrically coupled with the second source/drain region. An uppermost surface of the second sense/access line is beneath an uppermost surface of the first source/drain region.

Some embodiments include a memory device comprising a memory array. The memory array has access transistors arranged in rows and columns. Each access transistor has a first source/drain region, a second source/drain region and a channel region between the first and second source/drain regions. The access transistors have gates spaced from the channel regions by dielectric material. Capacitors are over the first source/drain regions and are electrically coupled with the first source/drain regions. Digit lines are over the second source/drain regions and are electrically coupled with the second source/drain regions. Uppermost surfaces of the digit lines are beneath uppermost surfaces of the first source/drain regions. The digit lines extend along the columns. Wordlines extend along the rows and include the gates of the access transistors.

Some embodiments include a method of forming a memory device. A substrate is provided to have rows of semiconductor material fins. The rows are spaced from one another by insulative material fill. Individual fins within the rows include first and second pedestals joined to one another through a valley region. Each row of fins has a left side and a right side when viewed end on. The left and right sides are in opposing relation to one another. First wordlines are formed on either the right sides or the left sides of each of the rows of fins while leaving the insulative material fill along the opposing sides of each the rows of fins. After the first wordlines are formed, second wordlines are formed on the opposing sides of each of the rows of fins.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory device comprising a memory array, wherein the memory array comprises:
   a fin having a first source/drain region, a second source/drain region and a channel region between the first source/drain region and the second source/drain region; the first source/drain region extending to a first height; the second source/drain region extending to a second height less than the first height; the channel region extending along a trough between the first source/drain region and the second source/drain region;
   a charge-storage device over the first source/drain region and electrically coupled with the first source/drain region;
   a first sense/access line along a sidewall of the fin and spaced from the channel region by dielectric material; and
   a second sense/access line over the second source/drain region and electrically coupled with the second source/drain region; an uppermost surface of the second sense/access line being beneath an uppermost surface of the first source/drain region.

2. The memory device of claim 1 wherein the second access/sense line comprises metal-containing material over conductively-doped semiconductor material.

3. The memory device of claim 1 wherein the charge-storage device is a capacitor.

4. The memory device of claim 1 wherein the first and second source/drain regions are p-type regions.

5. The memory device of claim 1 wherein the first and second source/drain regions are n-type regions.

6. The memory device of claim 3 wherein a portion of the capacitor extends to over the second access/sense line.

7. The memory device of claim 1 wherein the second access/sense line comprises metal and extends to a region peripheral to the memory array.

8. The memory device of claim 7 wherein the second access/sense line extends to sense amplifier circuitry within the region peripheral to the memory array.

9. The memory device of claim 7 wherein the second access/sense line extends to row driver circuitry within the region peripheral to the memory array.

* * * * *